United States Patent [19]

Weiss et al.

[11] Patent Number: 5,434,842
[45] Date of Patent: Jul. 18, 1995

[54] READING AND WRITING STORED INFORMATION BY MEANS OF ELECTROCHEMISTRY

[75] Inventors: Paul S. Weiss; Stephan J. Stranick, both of State College, Pa.

[73] Assignees: Biotechnology Research and Development Corporation, Peoria, Ill.; The Penn State Research Foundation, University Park, Pa.

[21] Appl. No.: 92,133

[22] Filed: Jul. 15, 1993

Related U.S. Application Data

[63] Continuation-in-part of Ser. No. 916,165, Jul. 17, 1992, Pat. No. 5,268,573, and a continuation-in-part of Ser. No. 979,597, Nov. 20, 1992, Pat. No. 5,281,814, and a continuation-in-part of Ser. No. 56,348, Apr. 30, 1993, abandoned, which is a continuation-in-part of Ser. No. 916,165, Jul. 17, 1992, Pat. No. 5,268,573.

[51] Int. Cl.$^6$ .............................................. H01J 37/28
[52] U.S. Cl. .................................................... 369/126
[58] Field of Search ......................... 369/126, 306, 307

[56] References Cited

U.S. PATENT DOCUMENTS

| 3,566,262 | 2/1971 | Thompson | 250/306 |
| 4,575,822 | 3/1986 | Quate | 369/126 |
| 4,941,753 | 7/1990 | Wickramasinghe | 250/307 |
| 5,060,248 | 10/1991 | Dumoulin | 378/53 |
| 5,268,573 | 12/1993 | Weiss et al. | 250/306 |
| 5,281,814 | 1/1994 | Weiss et al. | 250/306 |

FOREIGN PATENT DOCUMENTS

| 0073304 | 3/1983 | European Pat. Off. |
| 0272935 | 6/1988 | European Pat. Off. |
| 0307210 | 3/1989 | European Pat. Off. |
| 0307211 | 3/1989 | European Pat. Off. |
| 0363147 | 4/1990 | European Pat. Off. |
| 0435645 | 7/1991 | European Pat. Off. |
| 1173533 | 7/1964 | Germany |
| 2157876 | 10/1985 | United Kingdom |

OTHER PUBLICATIONS

G. Meijer er al., *Nature*, 348, 621 (1990). "Imaging C$_{60}$ cluster on a surface using a scanning tunnelling microscope".

"Non-Linear Alternating-Current Tunneling Microscopy," Kochanski, *Physical Review Letters*, 62:19, pp. 2285–2288, May 1989.

"A Versatile Microwave–Frequency–Compatible Scanning Tunneling Microscope," Stranick et al., *Rev. Sci. Instrum.*, 64(5):1232–1234, May 1993.

(List continued on next page.)

*Primary Examiner*—Paul M. Dzierzynski
*Assistant Examiner*—Don Wong
*Attorney, Agent, or Firm*—Majestic, Parsons, Siebert & Hsue

[57] ABSTRACT

By applying a voltage or signal and withdrawing or injecting an electron or electrons to a layer of material, it is possible to write, erase or read data electrochemically. The layer of material has at least one portion that will reversibly change between charge states in response to the applied voltage or signal and the withdrawal or injection of an electron or electrons. Alternatively, the material of the layer may be such that the portion of the layer of material will dissociate into components in response to the applied voltage or signal and injection or withdrawal of an electron or electrons. The stored data may be read using a scanning tunneling microscope by applying a voltage or signal thereto and detecting the current through, voltage across or signal reflected from the layer to detect the different charge states or structures of different portions of the layer. The signal or voltage applied can be a DC or AC signal, a signal pulse or transient or various combinations thereof. By using a material with more than two charge states or with multiple locations each with different charge states and by applying a signal with and detecting at a single or multiple frequencies, it is possible to write, erase or read multiple bits of information simultaneously.

50 Claims, 16 Drawing Sheets

OTHER PUBLICATIONS

Patent Abstracts of Japan, vol. 16, No. 317 (P-1384), Jul. 10, 1992 and JP,A,04 092 233 (Canon Inc.), Mar. 25, 1992.

Database WPI Week 8434, Derwent Publications Ltd., London, GB; AN 84-213438 and WO,84 03169 (Univ. Johns Hopkins et al.), Aug. 16, 1984.

Database WPI Week 8544, Derwent Publications Ltd., London, GB; AN85271104 and EP,A,0 159397 (Johns Hopkins Univ), Oct. 10, 1985.

Database WPI Week 7514, Derwent Publications Ltd., London, GB; AN 75-22796W and DE,A,24 42 581 (Sagami Chem Res Center), Mar. 27, 1975.

"Course Tip Distance Adjustment and Positioner for a Scanning Tunneling Microscope," Frohn et al., *Rev. Sci. Instrum.*, 60(6):1200–1201, Jun. 1989.

"Nanosources and Manipulation of Atoms Under High Fields and Temperatures: Applications," edited by Binh et al., NATO ASI Series, Series E: Applied Sciences, vol. 235, pp. 19–33.

Product brochure entitled "The Beetle STM–A Versatile, UHV Compatible Scanning Tunneling Microscope."

"An Easily Operable Scanning Tunneling Microscope," Besocke, *Surface Science, 181:145–153, 1987.*

"Generation of Mirowave Radiation in the Tunneling Junction of a Scanning Microscope," by W. Krieger et al., Journ. of Vac. Sci. and Technol., Part B, vol., 41, No. 14, pp. 10229–10232, Mar. 15, 1990, New York.

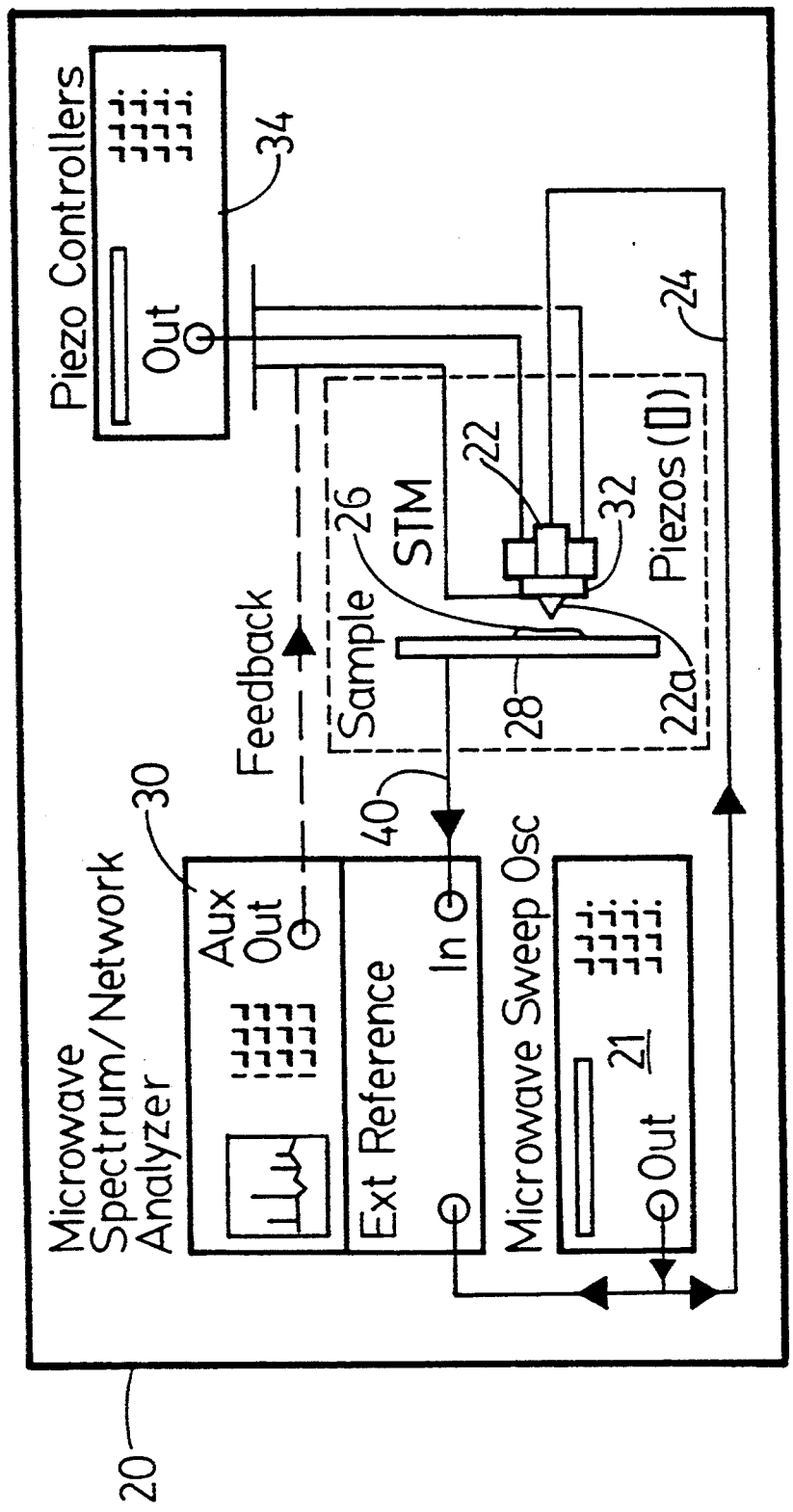
FIG._1.

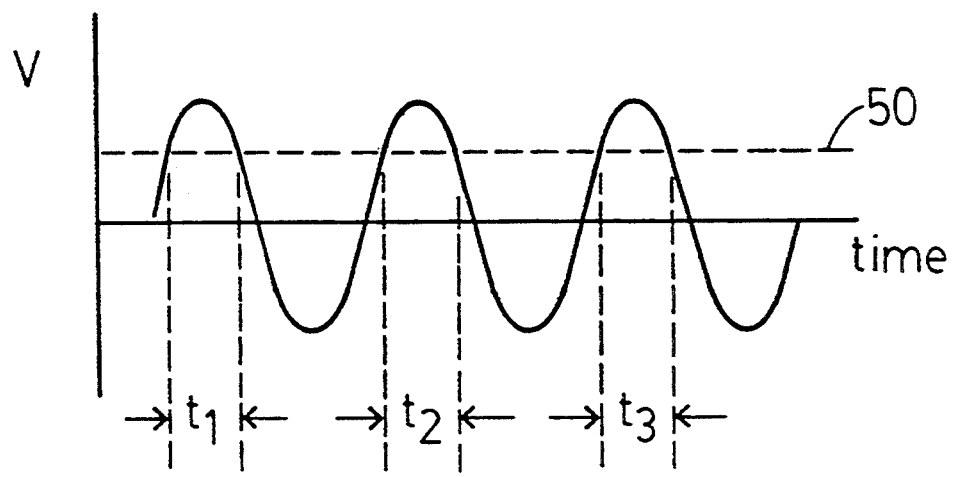
FIG._2A.
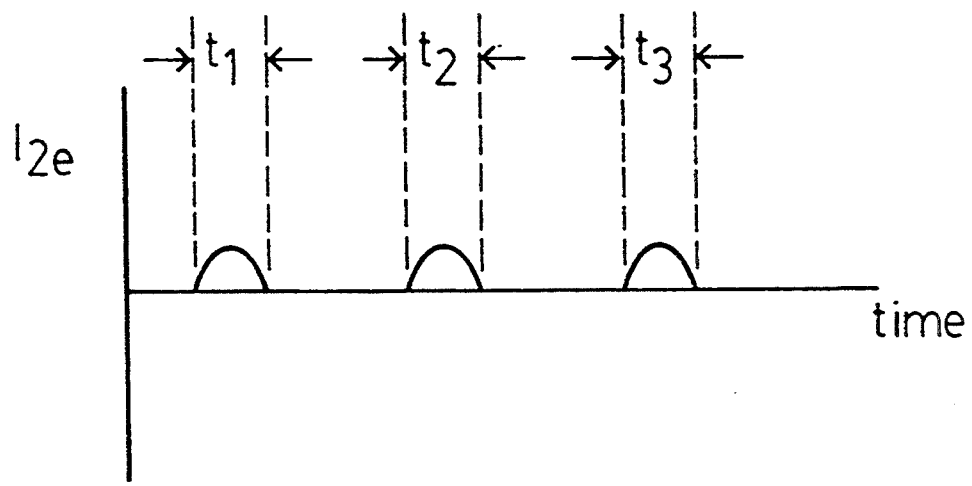
FIG._2B.

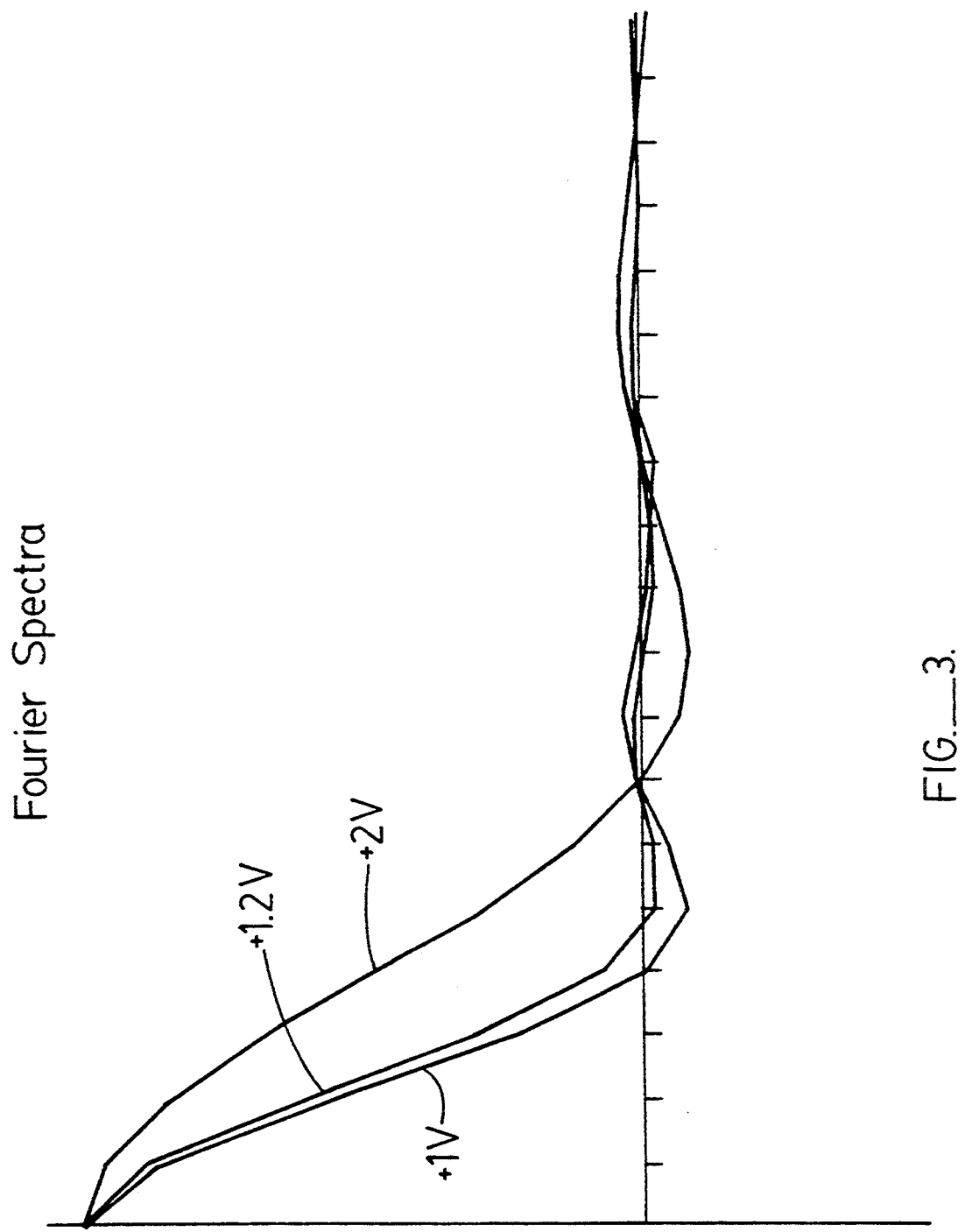

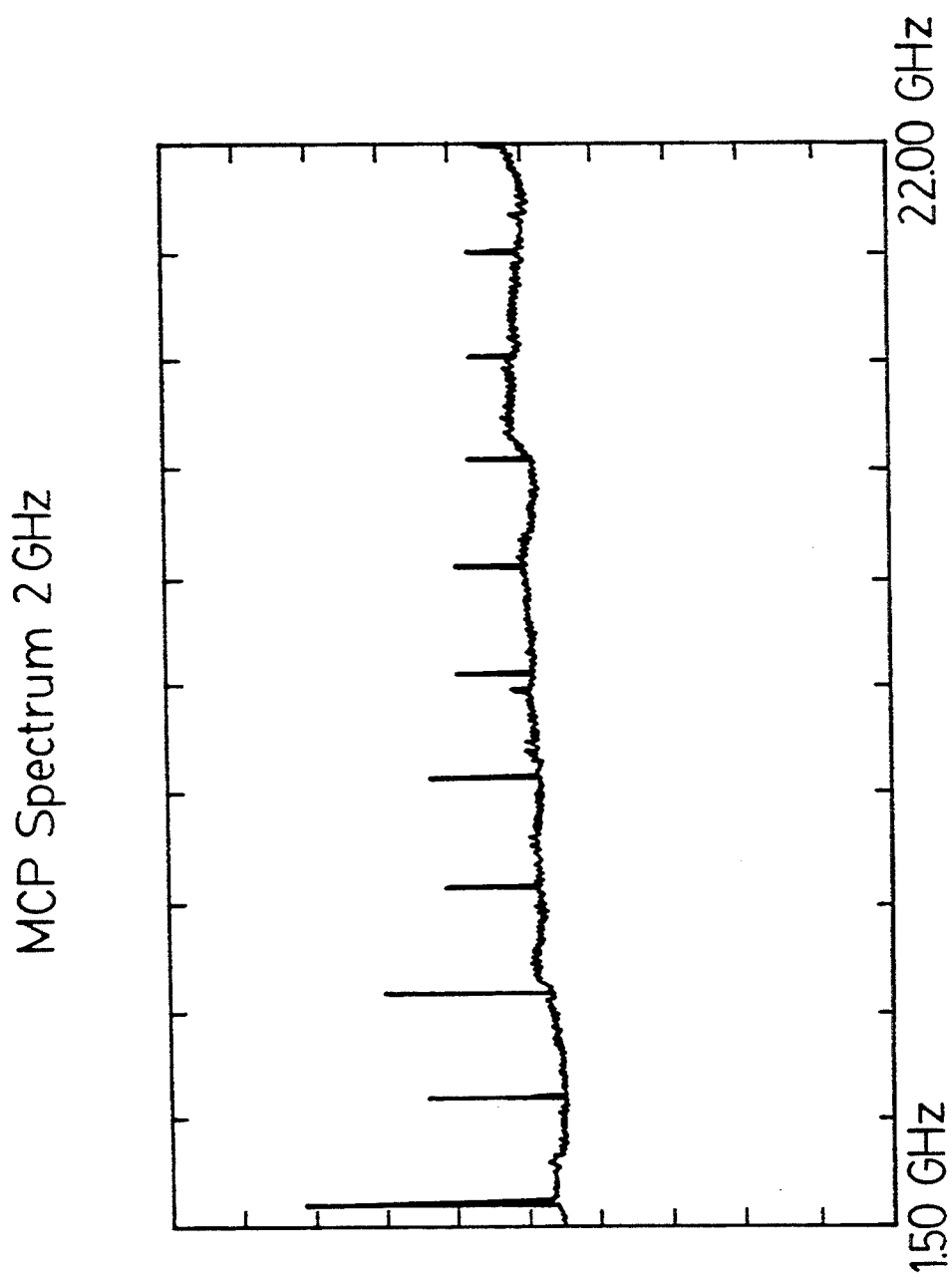
FIG._4.

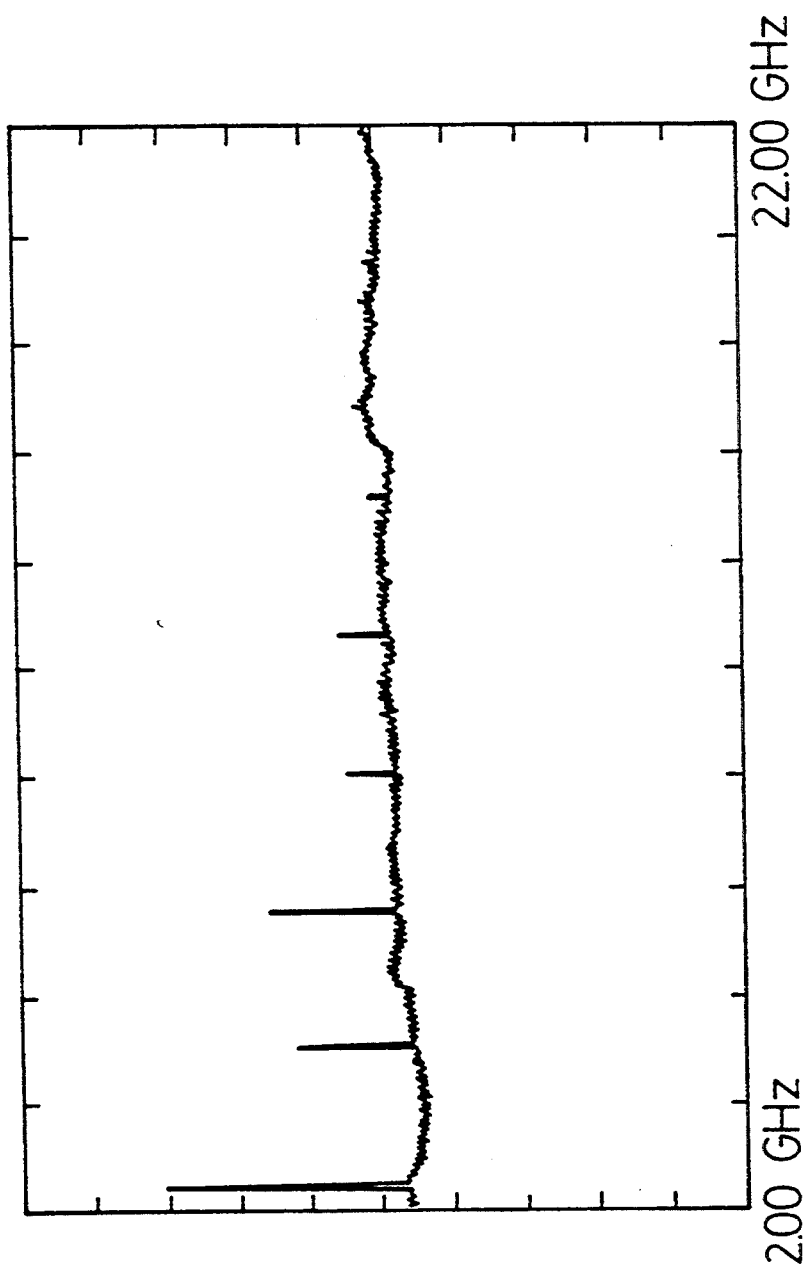
FIG._5.

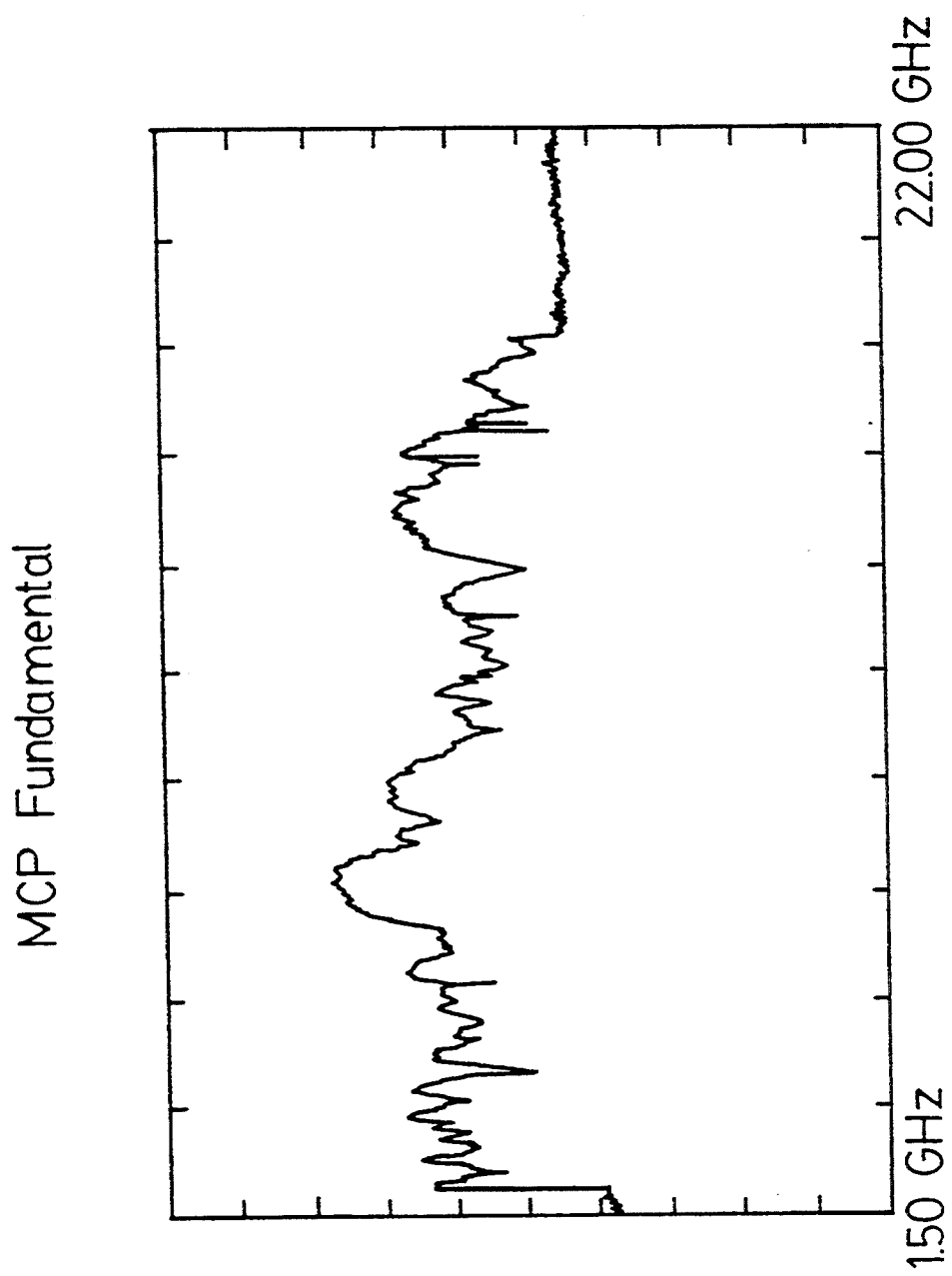
FIG._6.

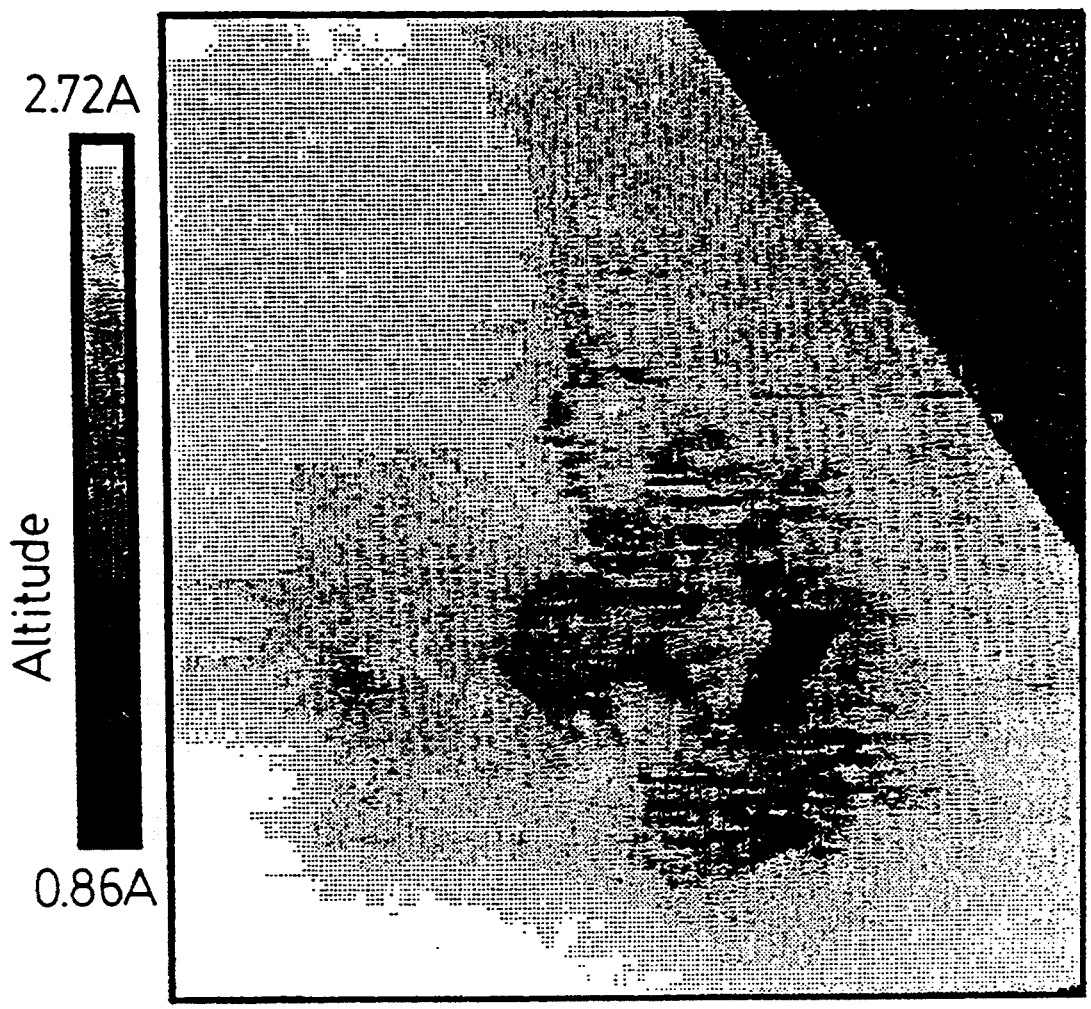
FIG._7.

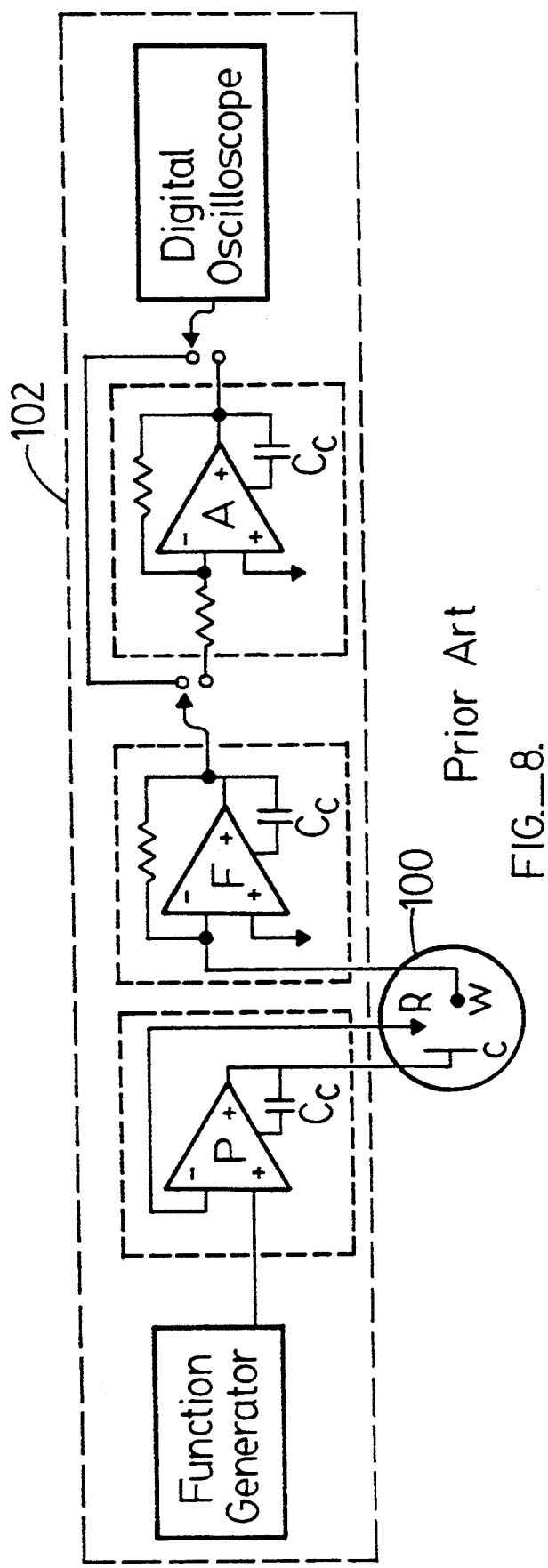
FIG._8.
Prior Art
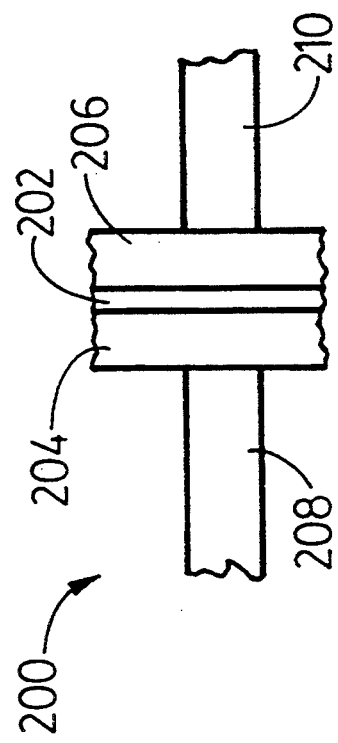
FIG._9.

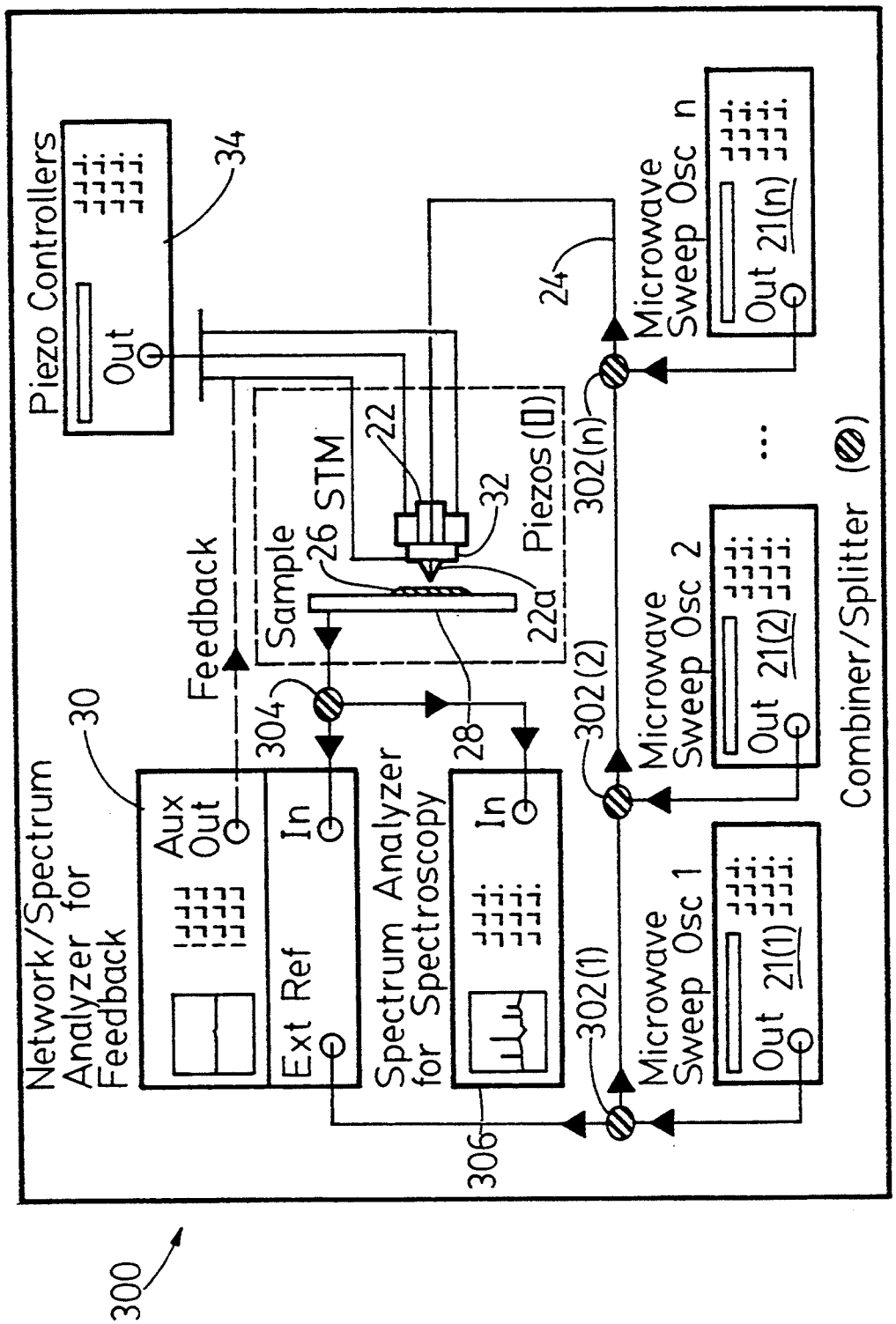
FIG._10.

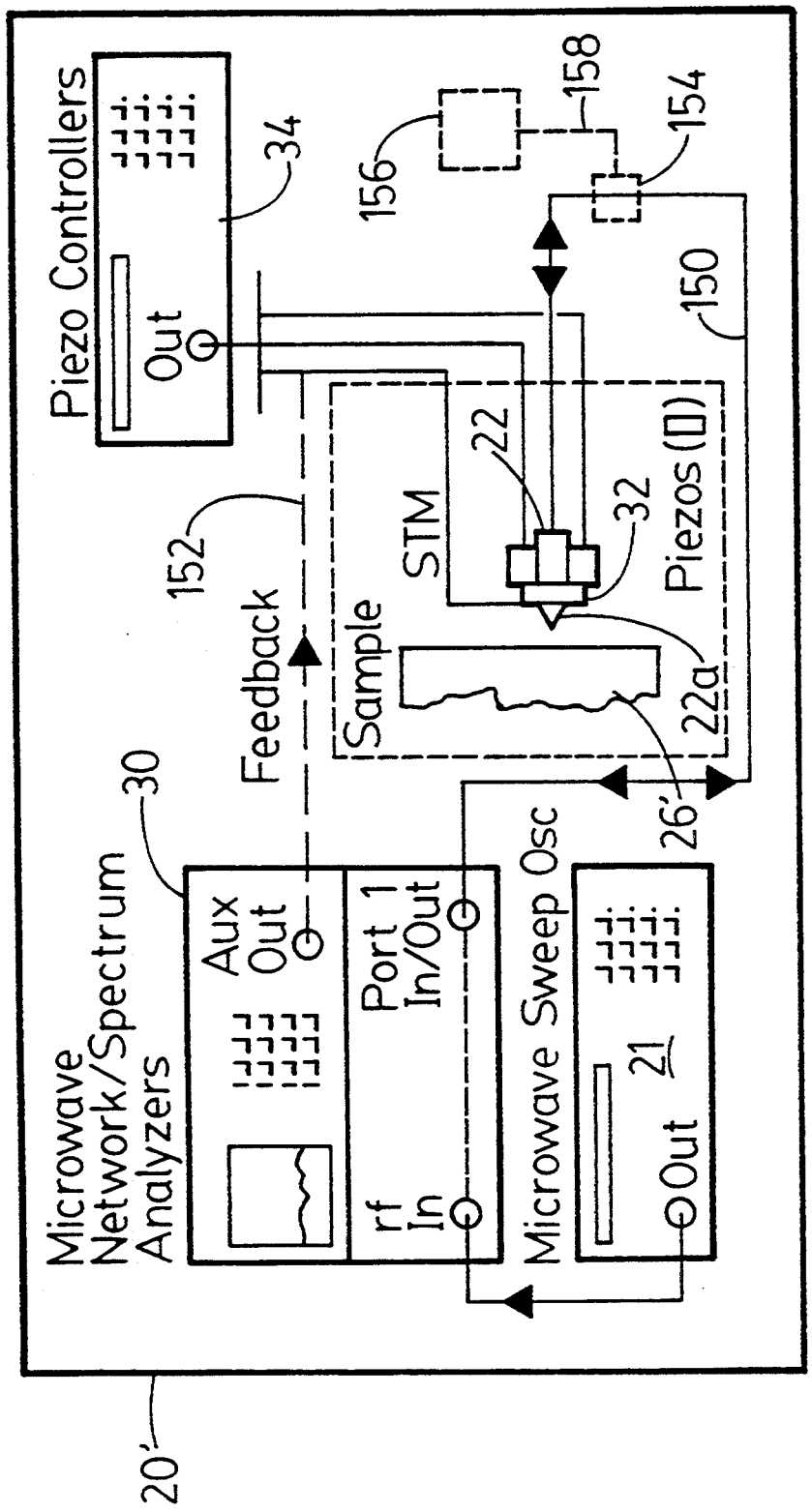
FIG._11A.

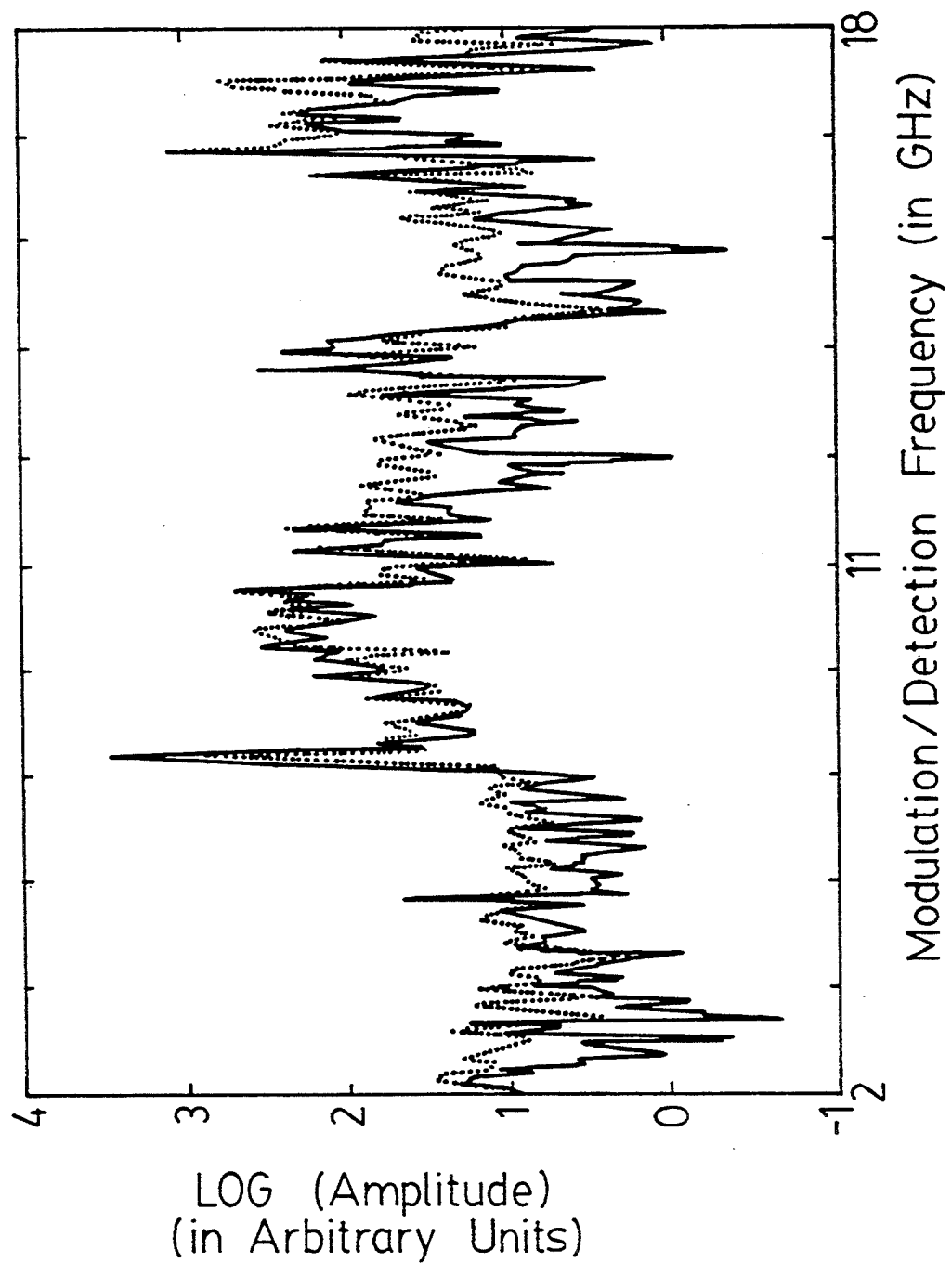
FIG._11B.

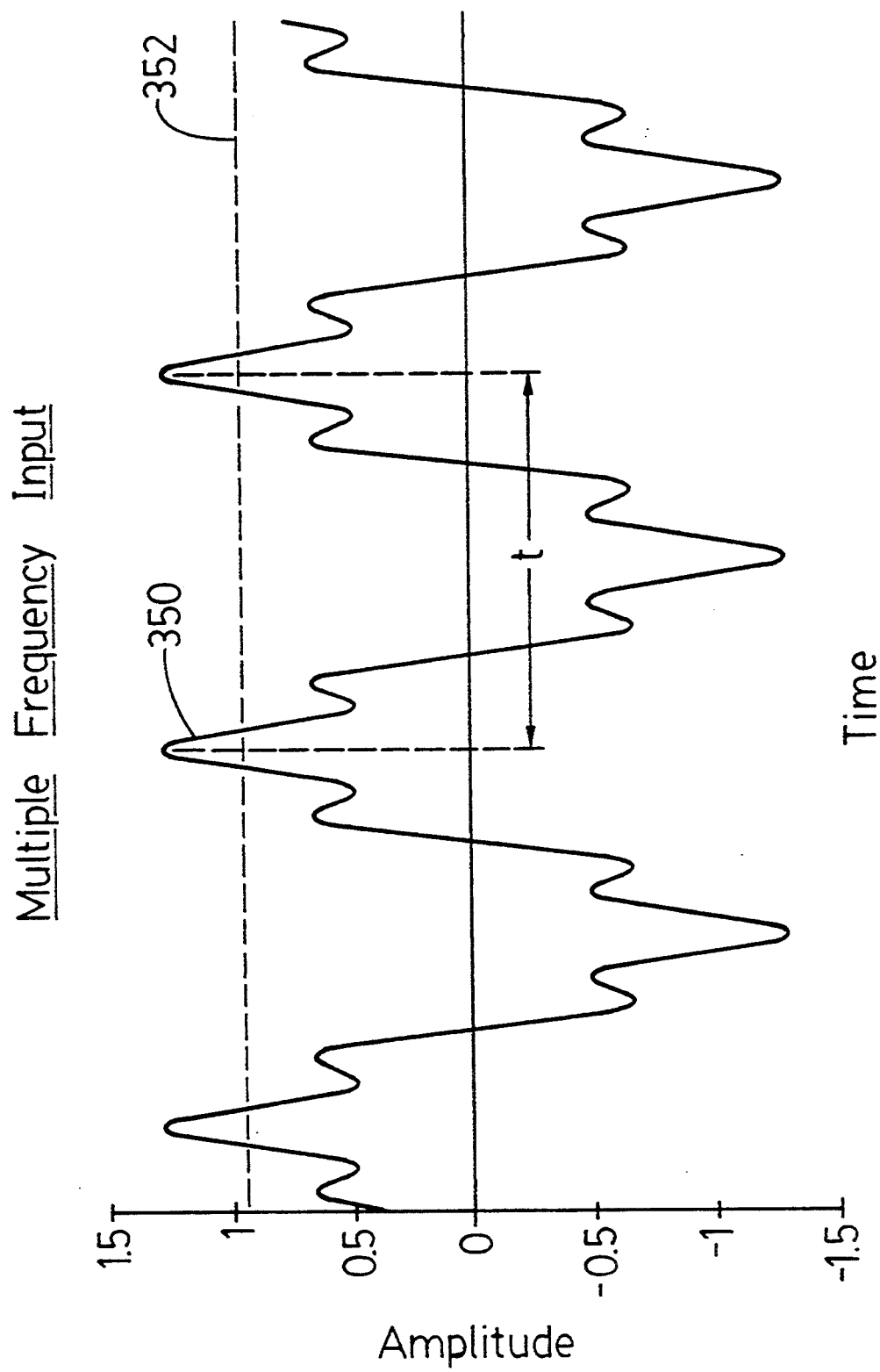
FIG._12.

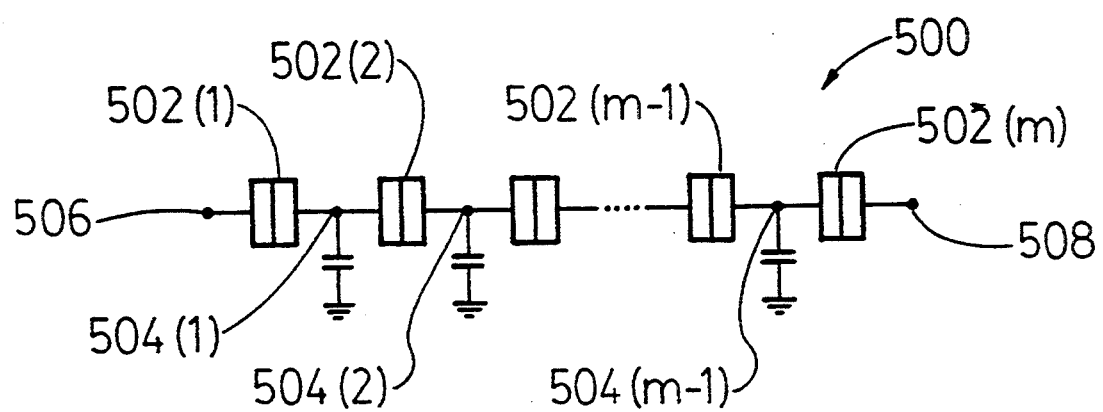
FIG._13A.
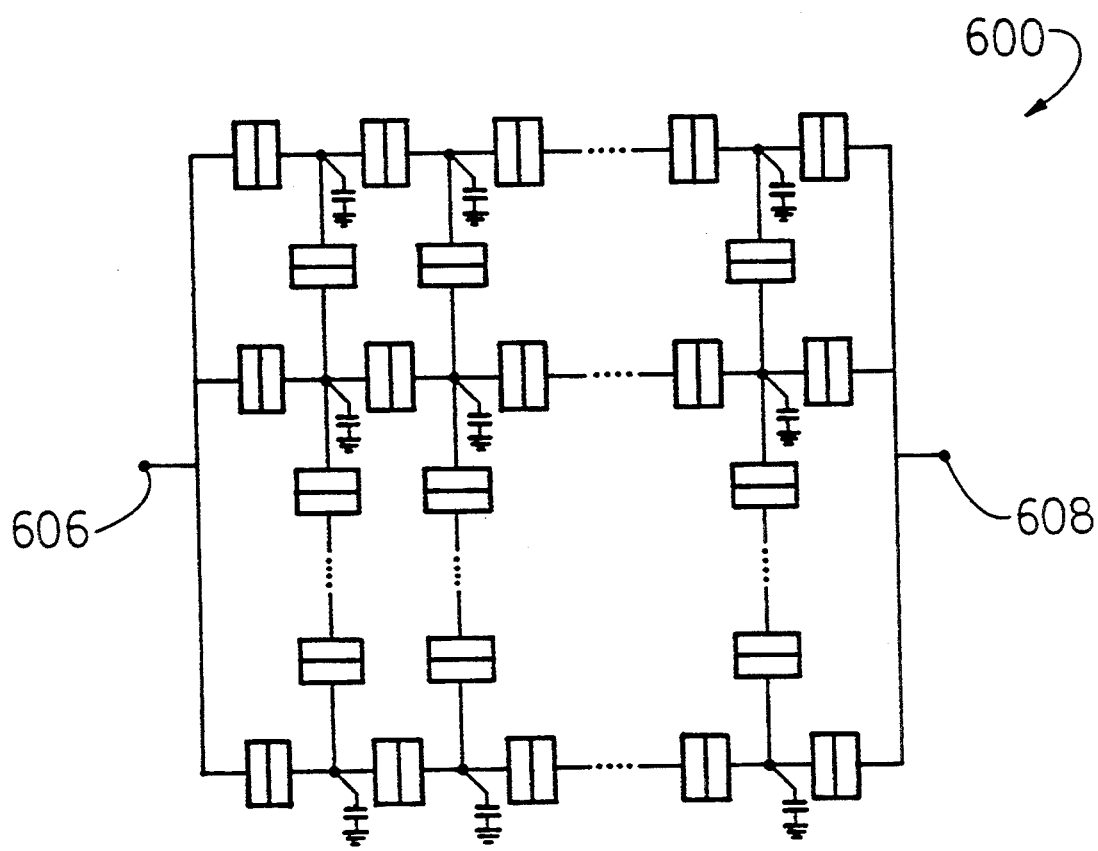
FIG._13B.

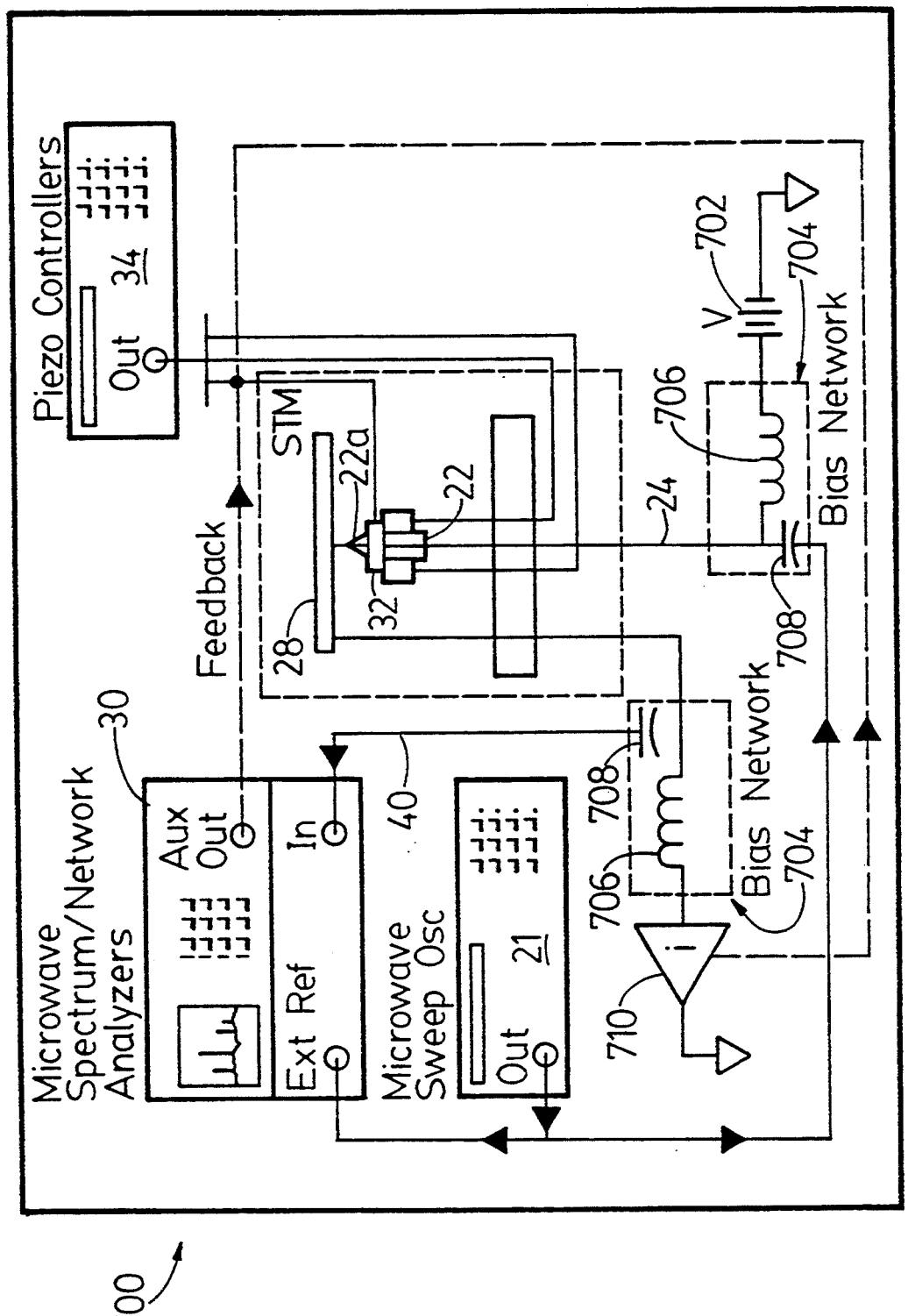
FIG._14.

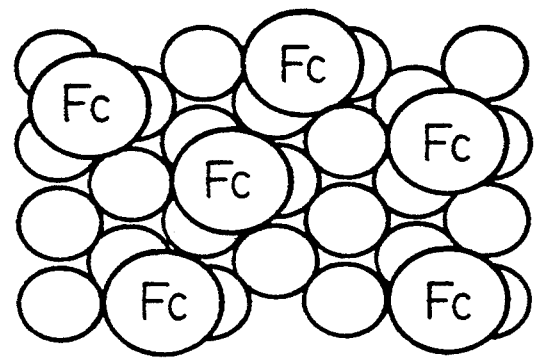
Top View
FIG.—15A.
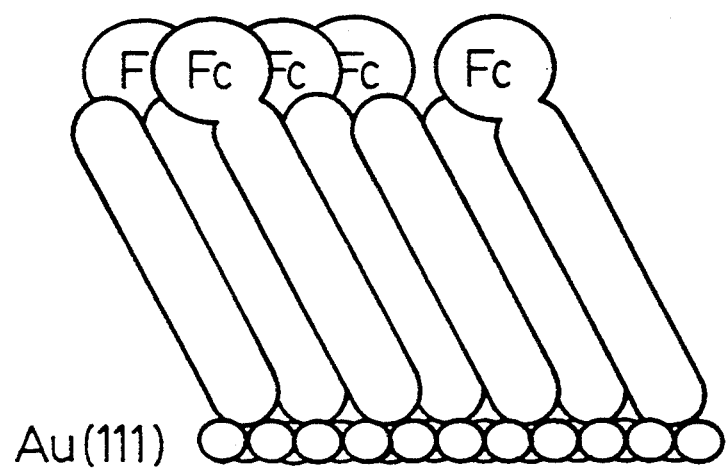
Au(111)
Side View
FIG.—15B.

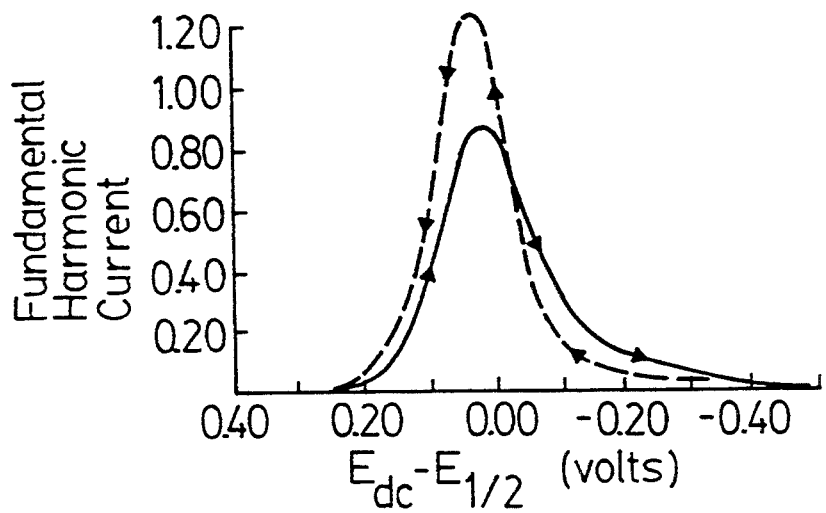
FIG._16A.
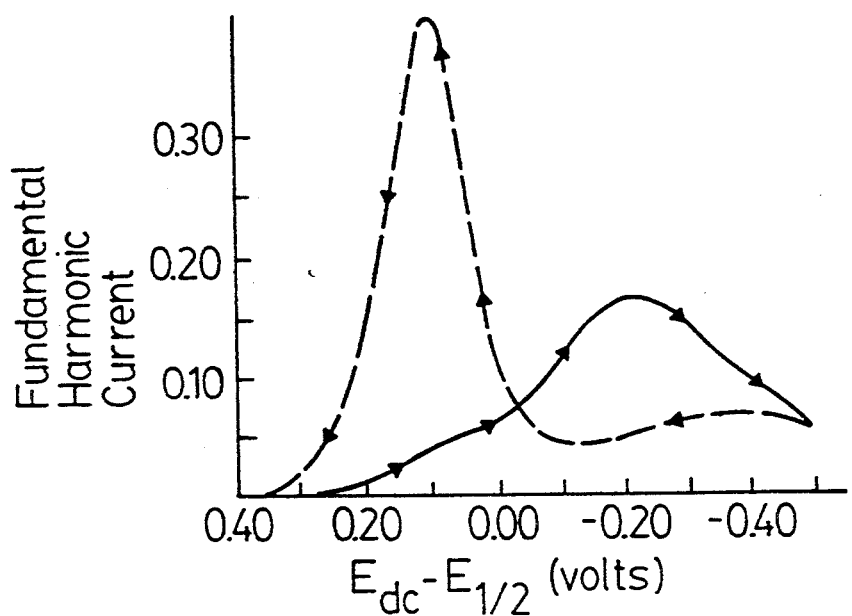
FIG._16B.
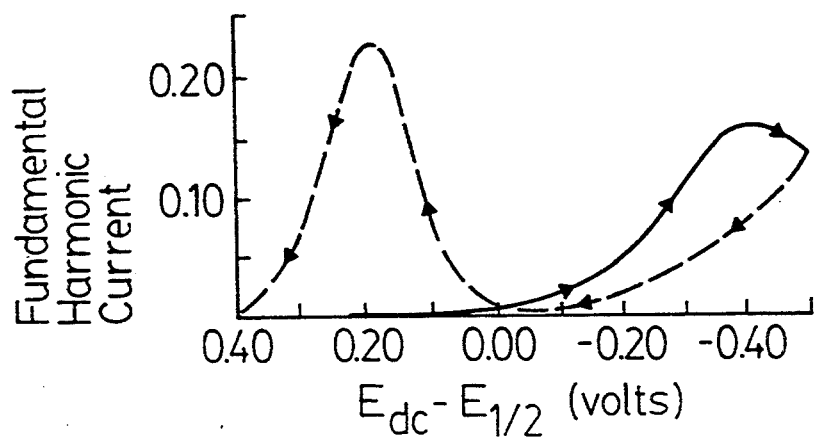
FIG._16C.

READING AND WRITING STORED INFORMATION BY MEANS OF ELECTROCHEMISTRY

CROSS-REFERENCE TO RELATED APPLICATIONS

This application is a continuation-in-part of three parent applications:

1. U.S. patent application Ser. No. 916,165 filed Jul. 17, 1992 entitled "System for Detecting Threshold Phenomena Associated with and/or Atomic or Molecular Spectra of a Substance;" now U.S. Pat. No. 5,268,573.

2. U.S. patent application Ser. No. 979,597 filed Nov. 20, 1992 entitled "System for Imaging and Detecting Threshold Phenomena Associated with and/or Atomic or Molecular Spectra of a Substance by Reflection of an AC Electrical Signal;" now U.S. Pat. No. 5,281,814 and 3. U.S. patent application Ser. No. 08/056,348, filed Apr. 30, 1993, now abandoned, entitled "Multiple Source and Detection Frequencies in Detecting Threshold Phenomena Associated with and/or Atomic or Molecular Spectra," which is a continuation-in-part application of U.S. patent application Ser. No. 916,165 filed Jul. 17, 1992, now U.S. Pat. No. 5,268,573.

This application is also related to U.S. application entitled "Multiple Source and Detection Frequencies in Detecting Threshold Phenomena Associated with and/or Atomic or Molecular Spectra," by Paul S. Weiss and Stephan J. Stranick, filed on the same day as this application and referred to below as the companion application. The parent applications and the companion application are incorporated herein by reference in their entirety.

BACKGROUND OF THE INVENTION

This application relates in general to the reading and writing of stored information and, in particular, to a system for reading and writing stored information through electrochemical changes.

With the advent of instruments such as the scanning tunneling microscope (STM), it is now possible to investigate the structure, spectra and dynamics of biological molecules and membranes as well as other substances at the atomic or molecular level. While more than a thousand STM's have been in operation and the instrument has sparked great interest in spectroscopy, the actual headway that has been made in this area remains rather modest. Thus, Bob Wilson and co-workers at IBM Almaden have made some progress in distinguishing closely related adsorbed surface species in STM images. G. Meijer et al., *Nature* 348, 621 (1990). In "Non-Linear Alternating-Current Tunneling Microscopy," Kochanski, *Physical Review Letters*, 62:19, pp. 2285–2288 (May 1989), a method for scanning tunneling microscopy is described, where a non-linear alternating current (AC) technique is used that allows stable control of a microscope tip above insulating surfaces where direct current (DC) tunneling is not possible.

The STM has a counter electrode on which the sample to be investigated is placed and another electrode in the shape of a microscope probe with a tip placed at a small distance away from the sample surface. A DC or a low frequency AC signal is then applied across the pair of electrodes. The probe tip is then moved across the sample surface in a scanning operation and the changes in the current or voltage across the electrodes are monitored to detect the characteristics of the sample.

The distance between the probe tip and the counter electrode/sample is controlled by a piezoelectric driver in one of two possible modes: a constant current mode and a constant height mode. The current or voltage detected between the pair of electrodes is used to derive a control signal for controlling the piezoelectric driver in the constant current mode to change the distance between the probe tip and the sample so as to maintain a constant current between the electrodes. The voltage that has been applied to the piezoelectric driver in order to keep the tunneling current constant indicates the height of the tip z(x,y) as a function of the position (x,y) of the probe tip over the sample surface. A record of such voltages therefore indicates the topographical image of the sample surface. The constant current mode can be used for surfaces which are not necessarily flat on an atomic scale. A disadvantage of the constant current mode is the time required for the electronic and piezoelectric components in the feedback loop for controlling the piezoelectric driver; this response time sets relatively low upper limits for the scan speed.

To increase the scan speed considerably, the feedback loop response is slowed or turned off completely so that the probe tip is rapidly scanned at a constant average distance to the counter electrode irrespective of the contours of the sample surface. The rapid variations in the tunneling current are recorded as a function of location (x,y) to yield the topographic information of the sample surface. This is known as the constant height mode referring to the fact that the probe tip is maintained at a constant average distance from the counter electrode.

The constant height mode is advantageous over the constant current mode since it has a faster scan rate not limited by the response time of the feedback loop. Consequently, slow dynamic processes on surfaces can be studied. On the other hand, it is more difficult to extract the topographic height information from the variations of the tunneling current. Furthermore, unless the sample is atomically flat, the tip might crash into a surface protrusion of the sample. For a more complete description of the two operating modes of the STM's, please see "Scanning Tunneling Microscopy I," by H.-J. Güntherodt R. Wiesendanger (Eds.), Springer-Verlag, pp. 5–6.

In the article referenced above, Kochanski proposes to investigate insulating films by applying an AC current between the electrodes at frequency $\omega$ and the current between the electrodes at $3\omega$ is detected. The AC signal is generated using a 2 GHz resonant cavity so that the frequency or frequencies of the signal applied to the STM electrodes and detected must be fixed in the scanning operation performed by Kochanski.

STM's have been used for applications in data storage. In "Atomic Emission from a Gold Scanning-Tunneling-Microscope Tip," by Mamin et al., *Phys. Rev. Lett.*, Vol. 65, No. 19, pp. 2418–2421, Nov. 5, 1990, and in "Gold Deposition from a Scanning Tunneling Microscope Tip," by Mamin et al., *J. Vac. Sci. Technol.*, B9(2), pp. 1398–1402, March/April 1991, a gold STM tip is used as a miniature solid-state emission source for directly depositing nanometer-size gold structures. First, the deposition speed is slow (of the order of one millisecond per bit) and imposes a lower limit on the writing speed despite the much faster scanning speed of the STM. The deposition features vary in size (from about 5 to 20 nanometers) so that one would have to assume the maximum possible size. If safe spacing is maintained between adjacent features for which maximum feature size is assumed, the density at which bits can be written using such deposition method is much reduced. Data storage by deposition is generally a cumbersome method where gold tips are consumed in the process and must be replaced.

Another method of chemical modification of a surface is disclosed in "Nanometre-Scale Chemical Modification using a Scanning Tunneling Microscope," by Utsugi, *Nature*, Vol. 347, pp. 747–749, Oct. 25, 1990. In this article, a STM is used to etch the surface of a mixed-ionic conductor ($Ag_xSe$), producing selected patterns of grooves about 10 nm wide. The positive voltage bias is applied to the STM tip. According to Utsugi, "owing to the high ionic conductivity of silver selenide, it seems probable that a positive bias to the tip provides a flux of mobile $Ag^+$ ions from the surface toward the underlying matrix (Ag migration), resulting in segregation of the Ag and Se." The migration of the silver ions exposes selenium ions which are then removed from the surface by reaction with ambient hydrogen. The above-described chemical modification by Utsugi, however, is irreversible. For this reason, it cannot be used for rewritable data storage which requires the erasing of data that has been stored by a writing process. Furthermore, Utsugi's method appears to require the use of a mixed-ionic conductor which can be etched by the application of a DC voltage and reaction with an ambient or other gaseous atmosphere.

Data recording and erasing are disclosed in "Nanometre-Scale Recording and Erasing with a Scanning Tunneling Microscopy, "by Sato et al, *Nature*, Vol 363, pp. 431–432, Jun. 3, 1993. In view of the irreversible nature of the method by Utsugi, Sato et al. proposed the recording and erasing of data by means of phase transitions. A tunneling current is established between the STM tip and the surface of a composite medium when a bias voltage modulated by pulsed voltages are applied to the tip. The tunneling current established creates marks on the surface which were then erased by applying a reverse-polarity pulse. The authors Sato et al. "attribute the recording process to a phase transition from the amorphous to the crystalline phase." The method disclosed by Sato et al., however, can only be repeated about ten times. According to the authors, "any recording mark subjected to writing and erasing pulses more than 10 times became impossible to erase."

None of the above-described methods is entirely satisfactory. It is therefore desirable to provide an improved system for writing and erasing information in which the above-described difficulties are overcome.

SUMMARY OF THE INVENTION

This invention is based on the observation that the above-described disadvantages of prior art solutions can be avoided by employing a layer of material having at least one portion that will reversibly change from a first charge state to a second charge state in response to an applied voltage or signal and withdrawal of electron or electrons and will change from the second charge state to the first charge state in response to an applied voltage or signal and injection of electron or electrons in order to store or erase data. Unlike the phase transition concept described above by Sato et al., using a layer of material having a portion that will reversibly change charge states in response to voltages or signals, data may be stored and erased an indefinite number of times using the layer of material. Furthermore, certain functional groups can have more than two charge states so that one location of the layer of material can store more than one binary bit of information. If the group has two different sites each of which has two or more charge states where the charge states at the two different sites can be altered independently of one another, two or more bits of information can be stored at each such group.

Instead of using charge states, another property of certain materials can be used for storing data. Thus, some material will oxidatively or reductively dissociate into components thereby changing the structure of the material in response to an applied voltage or signal and withdrawal or injection of an electron or electrons in order to store data.

One aspect of the invention is directed towards an apparatus for storing data comprising a layer of material having at least one portion that will reversibly change from a first charge state to a second charge state in response to an applied voltage or signal and withdrawal of an electron or electrons and will change from the second charge state to the first charge state in response to an applied voltage or signal and injection of an electron or electrons to store or erase data, or that will oxidatively or reductively dissociate into components thereby changing the structure of said at least one portion in response to an applied voltage or signal and withdrawal or injection of an electron or electrons in order to store data. The apparatus further comprises a source applying a voltage or signal to and withdrawing or injecting an electron or electrons from or to said at least one portion to change its charge state or to cause it to oxidatively or reductively dissociate into components, and a device for interrogating the at least one portion of the layer to detect the charge state or structure of the at least one portion in order to read the stored data.

Another aspect of the invention is directed towards an apparatus for storing data comprising a layer of material having at least first and second portions that will reversibly change from a first charge state to a second charge state in response to an applied voltage or signal and withdrawal or electron or electrons and change from the second charge state to the first charge state in response to an applied voltage or signal and injection of an electron or electrons to store or erase data. The apparatus further comprises a source for applying a voltage or signal to and withdrawing an electron or electrons from said first portion to cause it to change to or remain in the second charge state, and applying a voltage or signal to and injecting an electron or electrons to the second portion to cause it to change to or remain in the first charge state.

Yet another aspect of the invention is directed towards an apparatus for storing data comprising a layer of insulating material having a plurality of portions that will oxidatively or reductively dissociate into components, thereby changing the structure of said portions, in response to an applied voltage or signal and withdrawal or injection of an electron or electrons in order to store data. The apparatus further comprises a source applying a voltage or signal to and withdrawing or injecting electrons from or to one or more portions but not the remaining portions to oxidatively or reductively dissociate said one or more portions in the components, thereby changing the structure of said one or more portions in order to store data.

Still another aspect of the invention is directed towards a method for storing data employing a layer of material having at least one portion that will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components, thereby changing the structure of said at least one portion in response to an applied voltage or signal and withdrawal or injection of an electron or electrons in order to store data. The method comprises applying a voltage or signal and withdrawing or injecting an electron or electrons from or to said at least one portion to change its charge state or to cause it to oxidatively or reductively dissociate into components, and interrogating the at least one portion of the layer to detect a charge state or structure of the at least one portion in order to read the stored data.

An additional aspect of the invention is directed towards a method for storing data employing a layer of insulating material having at least first and second portions that will reversibly change from a first charge state to a second charge state in response to an applied voltage or signal and withdrawal of an electron or electrons and change from the second charge state to the first charge state in response to an applied voltage or signal and injection of an electron or electrons to store or erase data. The method comprises applying a voltage or signal and withdrawing an electron or electrons from said first portion to cause it to change to or remain in a second charge state, and applying a voltage or signal and injecting an electron or electrons to the second portion to cause it to change to or remain in the first charge state.

Yet one more aspect of the invention is directed towards a method for storing data employing a layer of insulating material having a plurality of portions that will oxidatively or reductively dissociate into components, thereby changing the structure of said portions in response to an applied voltage or signal and withdrawal or injection of electrons in order to store data. The method comprises applying a voltage or signal and withdrawing or injecting electrons from or to one or more portions but not to the remaining portions to oxidatively or reductively dissociate said one or more portions into components, thereby changing the structure of said one or more portions in order to store data.

BRIEF DESCRIPTION OF THE DRAWINGS

FIG. 1 is a schematic diagram of a high frequency STM for imaging insulator surfaces using throughput attenuation with a network analyzer, or using non-linear harmonic recording with a spectrum analyzer.

FIG. 2A is a graphical illustration of the modulated bias voltage used in the apparatus of FIG. 1 over time, where the dashed line shows the voltage threshold for a second electron to hop to (or from) the surface.

FIG. 2B is a graphical illustration of the resulting current due to the effect of the second electron versus time when the bias voltage of FIG. 2A is applied in the apparatus of FIG. 1.

FIG. 3 is a graphical illustration of the Fourier spectra detected when an AC signal is applied across a substance to be measured. The Fourier spectra includes three different graphs for three different substances having different thresholds.

FIG. 4 is a graphical illustration of the ratio of the current or voltage measured to the voltage or current applied to the STM electrodes across a predetermined spectrum when an AC signal of 2 GHz is applied across a substance.

FIG. 5 is a graphical illustration of the ratio of the current or voltage measured to the voltage or current applied to the STM electrodes across a predetermined spectrum when an AC signal of 2.5 GHz is applied across a substance.

FIG. 6 is a graphical illustration of the ratio of the current or voltage measured at the fundamental frequency to the voltage or current applied to the STM electrodes at the fundamental frequency to electrodes across a substance.

FIG. 7 is a plot of the alternating current STM image of the edge of a pore on a surface showing the microscopic details of the surfaces scanned.

FIG. 8 is a schematic diagram of an electrochemical cell and a circuit diagram of a potential controlling and current measuring instrument for monitoring the electrochemical cell in a conventional arrangement.

FIG. 9 is a schematic diagram of a Coulomb blockade device to illustrate the invention.

FIG. 10 is a schematic diagram of a high frequency STM and multiple oscillators and combiners for providing an AC signal of multiple frequencies and a network or spectrum analyzer for measuring simultaneously at multiple frequencies to illustrate the invention.

FIG. 11A is a schematic diagram of a high frequency STM for imaging insulator surfaces by measuring the reflected signal with a network analyzer, or a spectrum analyzer to illustrate the invention of this application.

FIG. 11B is a graphical illustration of the ratio of the current or voltage of the reflected signal measured using the scheme of FIG. 11A at the fundamental frequency to the voltage or current applied to the STM electrode at the fundamental frequency. Shown in FIG. 11B also is a graphical illustration of the ratio of the current or voltage of the signal transmitted through the same substance measured using the same scheme of FIG. 1 at the fundamental frequency to the voltage or current applied to the STM electrodes at the fundamental frequency to electrodes across a substance, where the reflected and transmitted signals are measured simultaneously.

FIG. 12 is a graphical illustration of an AC signal resulting by combining two signals of two different single frequencies to illustrate the invention.

FIGS. 13A, 13B are schematic diagrams illustrating a one-dimensional and a two-dimensional array respectively of Coulomb blockade devices to illustrate the invention.

FIG. 14 is a schematic diagram of a high frequency STM for imaging insulator surfaces using throughput attenuation with a network analyzer, or using non-linear harmonic recording with a spectrum analyzer, and a DC source and detector.

FIGS. 15A, 15B are schematic top and side views respectively of a mixed monolayer containing ferrocene-terminated (Fc) and unsubstituted alkanethiols coadsorbed on a gold Au (111) surface to illustrate one embodiment of the invention.

FIGS. 16A, 16B, 16C are graphical illustrations of voltammograms for reduction-oxidation (redox) systems to illustrate the invention.

DETAILED DESCRIPTION OF THE PREFERRED EMBODIMENT

The description herein below in reference to FIGS. 1–14 is mostly taken from the parent and companion applications. The features of the parent and companion applications as described in reference to FIGS. 1–14 are useful in reading the stored data that has been stored or erased using the features described below in reference to FIGS. 15A–16C.

FIG. 1 is a schematic diagram of a system 20 including a high frequency scanning tunneling microscope for imaging samples using throughput attenuation with a network analyzer, or using non-linear harmonic recording with a spectrum analyzer to illustrate the preferred embodiment of the invention. As shown in FIG. 1, a microwave sweep oscillator 21 generates an AC signal and applies it to microscope probe 22 with tip 22a (or to the sample 26 through counter electrode 28, not shown in FIG. 1) through line 24. Tip 22a is placed close to but spaced apart (by vacuum, a gas or a fluid) from a sample 26 which is placed on top of the counter electrode 28. Counter electrode 28 is connected to microwave spectrum/network analyzers 30. The position of the probe tip 22a over sample 26 is controlled by piezoelectric crystal 32 which is in turn controlled by piezo controllers 34. Controllers 34 receive from analyzers 30 a signal to be used for feedback.

In operation, the microwave sweep oscillator 21 applies the AC signal to tip 22a and analyzers 30 applies typically a reference voltage such as a virtual ground to counter electrode 28. The current or voltage between electrodes 22, 28 is monitored by analyzers 30 which derives a feedback signal for controlling controllers 34. In the constant current mode, this feedback signal is applied to the piezo controllers 34 for moving the tip 22a away from or towards the sample 26 in order to maintain a constant signal amplitude between electrodes 22, 28. In constant height mode, the distance between tip 22a and counter electrode 28 is maintained at a constant value and the feedback signal derived from the output of analyzers 30 is either not applied to controllers 34 or attenuated to a very low value before it is applied to controllers 34.

The scheme in reference to FIG. 1 differs from Kochanski's described above in that a tunable source is used to generate the AC signal applied across the electrodes and the amplitudes of the current or voltage can be measured simultaneously at frequencies within a predetermined spectrum using the analyzer. Analyzer 30 then computes the ratio between the amplitudes of the current or voltage measured to the amplitudes of the voltage or current applied by oscillator 21 to probe 22 at frequencies over a predetermined range or spectrum. Where the amplitudes are measured using a network analyzer, both the amplitudes and phases of current or voltage can be measured and used for imaging or spectroscopy.

When a voltage is applied across electrodes 22, 28, depending on the threshold of the substance in sample 26 at the position of the tip 22a and the distance between sample 26 and the tip 22a, electrons may tunnel between tip 22a and the sample. Such tunneling phenomena has been the subject of studies, one of which is set forth in the article "Single Electronics," by Likharev et al., *Scientific American*, pp. 80–85 (June 1992). As noted by Likharev et al., the application of a voltage across an insulating layer will cause a surface charge Q to build up across the barrier. When an electron tunnels through the insulating layer, the surface charge Q will change exactly by $+e$ or $-e$, depending on the direction of tunneling, where e is the electrical charge of a single electron. If the charge Q at the junction is greater than $+e/2$, an electron can tunnel through the junction in a particular direction, subtracting e from Q. The electron will tunnel in the opposite direction if the charge Q is less than $-e/2$. If Q is less than $+e/2$ and greater than $-e/2$, tunneling in any direction would increase the energy of this system. If the initial charge is within this range, tunneling would not occur and this suppression of tunneling is known as Coulomb blockade.

If the surface charge Q falls outside the range for Coulomb blockade so that electron tunnels through the insulating layer, which may cause the surface charge Q to fall within such range again. In such event, further tunneling is not possible. This is caused by the effect of the electric field exerted by the electron which has tunneled through on other electrons which may follow in its path.

The effect of applying a sinusoidal voltage across two electrodes separated by an insulating layer is shown in FIG. 2A. Thus, when the voltage applied exceeds a certain threshold 50 shown in dotted line in FIG. 2A, this causes the surface charge across the insulating layer to exceed the Coulomb blockade range. Thus, it is only during the time periods t1, t2, t3 that more than one electron can tunnel through the insulating layer in a single cycle to cause the current flow as shown in FIG. 2B.

The invention of this application is based on the observation that the threshold voltage of the substance in the sample can be determined by measuring the amplitudes of the current or voltage across electrodes over a predetermined frequency spectrum. Also, by inverse Fourier transform from the frequency domain to the time domain or by measuring directly in the time domain, graphs such as those in FIG. 2B can be obtained for determining the threshold of the substance in the sample. The Fourier spectra of three different substances with respective thresholds of 1 volt, 1 and 2 volts, and 2 volts are illustrated in FIG. 3. Thus, by performing an inverse Fourier transform of the three spectra, the respective thresholds of 1 volt, 1 and 2 volts, and 2 volts can be obtained. In this connection, FIG. 4 is a graphical illustration of a spectrum of a substance when a 2 GHz signal is applied by oscillator 20 across electrodes. FIG. 5 is a graphical illustration similar to that of FIG. 4 except that the oscillator applies an AC signal of 2.5 GHz instead of 2 GHz.

As illustrated in FIGS. 2A, 2B, when the amplitude of the AC signal applied across the electrodes is varied, such as where the amplitude is continually increased, one will see a sudden increase in the current flow between the electrodes when a threshold is reached. This will cause a sudden change in current and voltage across the electrodes which can be detected to indicate the presence of a threshold. This may be accomplished by comparing the amplitudes of the high harmonics to those of the low harmonics of the driving frequency of oscillator 21. When the amplitude of the AC signal applied across the electrodes is varied by gradually reducing the amplitude, the surface charge buildup on one side of the insulating barrier caused by the tunneling electrodes would tend to dissipate because of the mutual repulsion of the electrons. The dissipation rate of the electrons will reveal the rates of motion of charges in the substance, and the charge transport characteristics of the substance. When the amplitude of the signal is varied, the frequency of the signal is preferably kept substantially constant.

Oscillator 21 may be used to provide different frequency input AC signals across the electrodes. The amplitudes of the current or voltage across the electrodes may be measured as described above to obtain the spectra such as those shown in FIGS. 3–5 for different frequency input signals. Preferably, the amplitude of the signal provided in the above procedure remains substantially unchanged when the frequency of the signal provided by oscillator 21 is varied. From the various spectra obtained, an optimum value may be obtained for the frequency of the signal applied by oscillator 21, such as one which maximizes the signal detected. FIG. 6 illustrates such a feature. FIG. 6 shows the frequency response at the fundamental for tip 22a at the same spot of the sample. In other words, FIG. 6 is a plot of the ratio of the amplitude at the fundamental frequency of the current or voltage measured to the amplitude of the voltage or current applied to the electrodes, as the fundamental frequency of the signal applied by oscillator 21 is swept from 1.5 to 22 GHz. In other words, if the frequency response at the fundamental frequency is measured as the frequency of the applied signal sweep, the optimum frequency is indicated by the peak of the curve in FIG. 6 at about 7.7 GHz. This indicates that when the input signal is at such frequency, the signal recorded is maximum at the fundamental frequency. Obviously, the amplitudes at frequencies other than the fundamental may be used instead and are within the scope of the invention. FIG. 6 is obtained by sweeping the fundamental frequency supplied by the oscillator 21 under control of the analyzer 30, although this frequency can also be swept independently.

Once the optimum frequency is discovered, oscillator 21 may be tuned to such frequency and the STM is used in an otherwise conventional manner in either the constant current or constant height mode for differentiating surface species or for obtaining images of the surfaces of a substance or sample. By selecting particular frequencies which allow contrast between different surface species, the AC STM can be used to generate a map of the chemical species, the chemical environment or physical structure on the surface.

It is important to determine the spectral match (or lack thereof) between measurements of a known species and an unknown. The information may be used to determine the surface composition of one area versus another, or to intercompare an unknown with a previously characterized sample. Samples that can be visually intercompared with known spectra for identification purposes are the simplest case. If the differences are more subtle, a mathematical convolution of the known and unknown to highlight the differences assists the user to see the degree of agreement or lack thereof between the spectra. Where multiple source and detection frequencies are employed in the invention of the present application, such convolution is especially useful since more data would be available for a constrained fit. There are cases where the spectra are qualitatively very similar, or the signal to noise ratio is poor, or it is desired to have a numerically based recognition of match. A statistical intercomparison of the spectra can be used to differentiate an unknown amongst a wide range of candidates. There are many approaches. Amongst them are the least square distance between spectra or a calculation of the eigenvector distance between spectra in n-dimensional space.

Where the amplitudes of the current or voltage are to be measured at a fundamental frequency, a network analyzer is used. Where measurement of amplitudes at different frequencies across an entire spectrum is desired, a spectrum analyzer is used. Other instruments that may be used include lock-in amplifiers, microwave transition analyzers measuring at one frequency and its harmonics, vector voltmeters and power meters with tunable filters.

FIG. 7 shows an image obtained of an edge of a pore on the surface using an STM employing the system of the invention of this application. Since the invention functions at the atomic or molecular level, it is possible to detect and measure surface species and other local phenomena.

The concept of this invention can be used not only for application to STM but also to other technologies including Coulomb blockade applications and electrochemical applications.

The invention of the parent application is particularly useful for detecting fast electrochemistry. This is useful for analyzing electrochemically generated species before they diffuse away from the electrode at which they are generated and/or undergo subsequent reaction. It is also possible to analyze chemical species where the electrochemical environment is rapidly changing, such as in electrochemical probing of living cells. Fast electrochemistry can also be used to determine reaction rates and mechanisms. By using a very high modulation frequency, it is possible to measure extremely small numbers of molecules at very small electrodes by being able to measure a signal from each molecule present repeatedly as a form of signal amplification.

FIG. 8 is a schematic view of an electrochemical cell and a circuit of a potential controlling and current measuring instrument for monitoring the cell in a conventional arrangement taken from "Ultramicroelectrodes: Cyclic Voltammetry Above One Million V $s^{-1}$," by Andrieux et al., *J. Electroanal Chem.*, 248:447–450 (1988). As shown in FIG. 8, electrochemical cell 100 is monitored by circuit 102 having counter electrode C, reference electrode R, and working electrode W. The scheme in FIG. 8 can be readily modified so that a concept of the invention may be applied thereto. In reference to FIGS. 1 and 8, the working electrode W is connected to analyzers 30 in the same way as counter electrode 28 of FIG. 1. The output of oscillator 21 is applied to counter electrode C and reference electrode is connected to analyzers 30. Then the above-described operation for the STM may be adapted for measuring the fast electrochemistry of cell 100.

By using a very small working electrode, the capacitance of the bilayer (the molecules aligned at the electrode surface) is reduced, thereby reducing the associated RC time constant of the electrochemical cell 100 in order to increase the speed of the measurement. In reference to FIG. 8, a high frequency AC signal with or without a DC bias is applied to the counter electrode and the frequency spectrum at the current at the working electrode is sensed. The frequency spectrum obtained from such measurements will reflect the current/voltage curves, since the current/voltage characteristics of the electrochemical cell are highly non-linear. Working at high frequency will outrun certain processes such as diffusion of electrochemically generated species away from the electrode. The DC bias can also be set to a feature of interest in the current/voltage characteristic of the electrochemical cell. Then by varying the modulation frequency, the rate of the electrochemical process can be monitored. As described in more detail below in reference to FIG. 14 of this application, in addition to an AC signal source, a source for applying a DC bias voltage and current is also included so that the AC signal from the oscillator 21 is superposed onto such DC signal before the summed time varying signal is applied to the cell 100.

FIG. 9 is a schematic view of a Coulomb blockade device 200 sandwiched between two conductive layers 204, 206 connected respectively to electrodes 208, 210. Again the dotted line box in FIG. 1 is replaced by the Coulomb blockade device 200 of FIG. 9 so that the general scheme of FIG. 1 may be used for monitoring the Coulomb blockade device 200. More specifically, electrode 208 may be connected to the network analyzers 30 through conductor 40 and electrode 210 may be connected to oscillator 21 through conductor 24. The scheme of FIG. 1 can then be used for measuring thresholds and charge dissipation rates in a manner similar to that described above for the STM. The thresholds are measured by varying the amplitude of the applied AC signal. When the amplitude is increased and a threshold is reached, only the peak of the sine wave will be at sufficient amplitude to transfer a second, third . . . electron across the insulating barrier 202. Thus, there will be a signal that is a fairly sharp feature in time. Short time features such as these correspond to high frequencies. An increase in the higher harmonics as this threshold is surpassed is expected. As the amplitude is further increased, the time period over which the sine wave amplitude is over the threshold is increased. This gives a more slowly varying signal, so that the amplitude of the higher harmonics decreases relative to the lower harmonics. If the amplitude of the current or voltage across the electrodes 208,210 are monitored at frequencies within a spectrum, the spectra obtained may be transformed using Fourier transform to obtain the threshold. Alternatively, if simply an indication of the threshold is needed, the sudden change in current or voltage across the electrodes 208, 210 will be adequate.

To measure the charge dissipation rates across device 200, after the thresholds are known, the modulation frequency is varied with the amplitude held constant. If charge escapes during a period, then the threshold (which is due to repulsion from the previous tunneled charge) disappears as does the corresponding non-linearity. The higher harmonics would then decrease as the signature that the dissipation is taking place on the time scale of the modulation. Again, by comparing the amplitudes of the high harmonics to those of the low harmonics of the driving frequency, such dissipation can be detected. This is the case also when a sample or an electrochemical cell is measured using a STM. By applying a summed signal having both AC and DC components in the manner described below in reference to FIG. 14, it is possible to maintain a DC bias at a certain level that would match or approach the threshold concerned while varying the modulation frequency or amplitude.

Since different molecules or particles will exhibit different spectra, it is possible to record the atomic or molecular spectra of a known substance to be a signature for comparison with atomic or molecular spectra of an unknown substance detected using the scheme above. The comparison will yield useful information on the composition of the unknown substance.

Further aspects of this invention will be explained below in reference to FIGS. 10–12. As described above, for a given substance in the sample, an optimum value may be obtained for the frequency of the signal applied by oscillator 21, such as one which maximizes the signal detected as illustrated in FIG. 6. Such optimum frequency is a characteristic of the substance. Generally speaking, two different substances will have two different optimum frequencies neither of which is an integral multiple of the other; in other words, the optimum frequency of each of the two substances is not a harmonic of the optimum frequency of the other substance.

In reference to FIG. 1, when sample 26 includes two different substances, two different optimal frequencies will be discovered using the apparatus of FIG. 1 as the fundamental frequency of the signal applied by oscillator 21 is swept. In such circumstances, one would have to choose one of the two optimal frequencies to maximize the signal recorded since oscillator 21 can only be tuned to one of the two optimal frequencies. Therefore, to obtain maximum recorded signals for the two substances, one would normally have to first tune oscillator 21 to one optimal frequency during a first run for measuring a first substance, and tune the oscillator to a second optimal frequency to measure a second substance during a subsequent second run. If the two substances are present simultaneously only for a short time period, measuring the two substances sequentially as described may not be feasible. It is therefore desirable to provide a system whereby two or more substances may be detected simultaneously and at optimal frequencies.

Where two different substances close together are measured over a spectrum as the input frequency is swept, the above described scheme may need to be modified. Instead of finding a single optimal frequency for both substances, to differentiate between the responses of the two substances, one would attempt to find a first optimal frequency where the response of a first substance is measurably higher than that of a second substance, and a second optimal frequency where the response of the second substance is measurably higher than that of the first substance. This may be possible even though at many other frequencies other than the first and second frequencies, the responses of the two substances are nearly the same. In such event, it would be useful to identify each of the substances by more than one frequency as its characteristic frequencies. Therefore, to obtain optimized results, one would supply to the ACSTM an input signal having components at each of the optimal frequencies.

FIG. 10 is a schematic view of a high frequency STM for imaging substances using a network or spectrum analyzer and multiple oscillators to illustrate the invention of this application. For convenience and description, identical components are labeled by the same numerals in all the figures of this application. The scheme 300 in FIG. 10 differs from that of FIG. 1 in that n microwave sweep oscillators 21(1), 21(2), . . . , 21(n) are used to supply signals of multiple frequencies instead of only one oscillator 21 supplying signals of a single frequency input. The output of oscillator 21(1) is applied to a combiner 302(1) where the output is split into two paths: one path towards combiner 302(2) and the other to the external reference port of the network/spectrum analyzer 30. Combiner 302(2) combines the outputs of oscillators 21(1), 21(2) and sends the combined signal to combiner 302(3) (not shown) which combines such combined signal with the output of oscillator 21(3) (not shown) and so on until combiner 302(n) combines the output of oscillator 21(n) with the outputs of the remaining (n-1) oscillators, and sends the combined signal from the n oscillators along line 24 to the STM probe 22. The combined signal from line 24 is applied to tip 22a and a current or voltage between electrodes 22, 28 is monitored by analyzer 30 or analyzer 306 in a manner described above. Instead of applying the signal to the probe 22, it is possible to apply it instead to the counter electrode and thus to the sample; the response of the sample is then detected using the probe. As described below in reference to FIG. 14, a DC voltage or current source may be used in addition to supply a DC bias voltage and current upon which the AC combined signal from the outputs of the oscillators are superposed and the combined or summed time varying signal including DC and AC components supplied to probe 22 or counter electrode through line 24. Such source has been omitted from FIG. 10 for simplicity, it being understood that such optional source is intended and is very useful for electrochemical and Coulomb blockade device applications as explained below. Alternatively, instead of using a number of oscillators and a DC source, it is also possible to use a source generating signal pulses or transients. In general, one can use a source that generates a DC signal, an AC signal, a signal pulse or a signal transient or a combination of two or more thereof; all such variations are within the scope of the invention.

A combiner that may be used is a combiner/splitter, although other devices that combine signals may be used as well and are within the scope of the invention. While the embodiments may be described in terms of combining signals and applying the combined signal to the ACSTM, it will be understood that mixers (not shown) may be used to mix the input signals instead and the mixed signal applied to the ACSTM and the invention as described herein will function in essentially the same way to provide all the advantages described herein. In such case, each of the combiners 302(1), 302(2), . . . , 302(n) would be replaced by a mixer instead.

If analyzer 30 is generating a feedback signal to controllers 34, then a separate spectrum analyzer 306 is needed to detect and record the detected signal spectrum while analyzer 30 is generating the feedback control signal. For this purpose, combiner or signal splitter 304 sends the current or voltage signal from the counter electrode 28 to analyzers 30 and 306.

Each of the frequencies of the outputs of the n oscillators can be chosen to isolate or to indicate particular features such as the use of spectral signatures or functional groups of molecules of interest. Each frequency or a combination of frequencies can be used to probe a particular chemical or physical aspect of the sample. In the context of this application, a combination of frequencies is defined as integral multiples (harmonics) of each of the frequencies, and/or sums or differences of such frequencies or multiples. Each of the frequencies from the oscillators and combinations thereof may be detected simultaneously using the spectrum/network analyzer 306. It is therefore possible to map the regions of surfaces containing particular chemical species or exhibiting particular phenomena (e.g., electrical charging).

Since the signal applied to probe 22 has a number of different input frequencies, the voltage or current signal detected from the counter electrode 28 and fed to analyzer 306 also has such frequencies and/or combinations thereof. One of these frequencies may be used for feedback purposes to control piezo controllers 34 and in order to control the height of probe 22 above counter 28. This may be accomplished by moving the probe tip or by moving the counter electrode and the sample. Thus, the detected signal from counter electrode 28 is split by combiner 104 into two paths, one to analyzer 30 and the other to spectrum analyzer 306 for spectroscopy. Analyzer 30 then uses one of the frequencies in the current or voltage from counter 28 to derive an error signal in a feedback path 110 to controllers 34 for controlling the height of probe 22 to reduce such error signal. For this purpose, the controllers 34 may control either the position of the probe tip 22a as shown in FIG. 10, or the position of the counter electrode 28 and the sample (not shown). It will be understood that manners of control other than those discussed above may also be used, such as a DC voltage from an optional DC source (not shown in FIG. 10). When an AC or DC feedback is employed to derive an error signal, such feedback action would tend to reduce the error signal so as to maintain a constant current flow between tip 22 and counter electrode 28. Alternatively, the feedback voltage may be turned to a very low value or not applied at all to controllers 34 in a "constant height mode."

Another aspect of the invention of this application will now be described by reference to FIGS. 11B, 11B below as well as the description above. FIG. 11A is a schematic diagram of a high frequency AC STM for imaging bulk insulator surfaces by measuring the reflected signal using the network analyzer, or using nonlinear harmonic recording with a spectrum analyzer. As shown in FIG. 11A, where the sample to be measured is a bulk insulator, such as a salt crystal or mineral or a living cell of an organism, it may not be possible to measure the tunneling current or voltage in the manner described above. In such circumstances, the apparatus 20' of FIG. 11A will enable such substance to be measured.

In the same manner as described above, the sweep oscillator 21 supplies an AC signal to analyzer 30 which in turn supplies a microwave signal to sample 26' through tip 22a of the STM. This signal is transmitted from analyzer 30 to the STM through cable 150. Instead of detecting the tunneling signal transmitted from tip 22a to sample 26', which is not possible for a bulk insulator, the signal transmitted by tip 22a and reflected by sample 26' is detected instead at tip 22a, where such reflected signal is transmitted by cable 150 back to analyzer 30 at input/output port 1. Analyzer 30 records the reflected signal received at port 1. As indicated above, analyzer 30 is capable of recording the amplitude at one frequency or amplitudes at different frequencies over a predetermined spectrum of signals and therefore records the amplitudes at different frequencies within a predetermined spectrum of the reflected signal from cable 150.

FIG. 11B is a graphical illustration of the ratio of the current or voltage of the reflected signal measured using the scheme of FIG. 11A at the fundamental frequency to the input voltage or current applied to the STM electrode at the fundamental frequency. Analyzer 30 is of the type which can record both the reflected signal and the transmitted signal where the transmitted signal is recorded in the manner described above in reference to FIG. 1. Thus where both the transmitted and reflected signals are detected, as where the substance is thin or small or conductive, the transmitted signal may be detected by another electrode (not shown in FIG. 11A but similar to electrode 28 of FIG. 1) and sent to analyzer 30 to a port (not shown in FIG. 11A) different from port 1. Shown also in FIG. 11B is a graphical illustration of the ratio of the current or voltage of the signal transmitted through the same substance as in FIG. 11A, measured using the scheme of FIG. 1 at the fundamental frequency to the voltage or current applied to the STM electrodes at the fundamental frequency to electrodes across a substance where the reflected and transmitted signals are measured simultaneously. In FIG. 11B, the reflected signal is plotted in solid lines whereas the transmitted signal is plotted in dotted lines. Thus, both the transmitted and reflected signals are measured when tip 22a of the STM is close to a sample 26'. This assumes that the sample 26' is not a bulk insulator so that the transmitted signal at electrode 28 of FIG. 1 can also be detected and measured and sent to analyzer 30.

As demonstrated in FIG. 11B, it appears that the spectrum of sample 26' obtained by detecting the reflected signal is similar to the spectrum obtained by detecting the transmitted signal caused when electrons tunnel through sample 26'. This demonstrates that, when electrons are transmitted by tip 22a towards sample 26', the signal reflected by the sample 26' back towards tip 22a has similar signal characteristics as the signal that is transmitted through the sample 26'. Hence, all of the above-described applications possible by detecting the transmitted signal caused by tunneling electrons are also possible where the reflected signal is detected instead of the transmitted signal. In addition, the reflected signal may be fed back through path 152 from analyzer 30 to controller 34 for controlling the distance between tip 22a and sample 26' in a constant current mode. Where such feedback path is turned off or severely attenuated, the STM is operating in constant height mode. This also demonstrates that where only one electrode is used to couple the signal to the sample or substance measured, measuring the reflected signal instead of the current through or voltage across the sample or substance is possible even though the sample or substance is electrically conducting.

Where the analyzer 30 used is not suitable for detecting the reflected signal from cable 150 also used to transmit the input signal to the sample, a directional coupler 154 shown in dotted lines in FIG. 11A may be used to separate the reflected signal from the input signal from oscillator 21 on cable 150, and this reflected signal is sent to an appropriate device 156 also shown in dotted lines in FIG. 11A through line 158. Device 156 then detects and measures the reflected signal. Device 156 may be a spectrum analyzer, a network analyzer, a vector voltmeter, a power meter used with tunable filters, or any other device capable of measuring amplitude versus frequency.

Where the scheme of FIG. 11A is used for detecting electrochemical changes, the configuration of FIG. 8 needs to be modified only in the sense that the reflected signals detected from the working electrode W are measured instead of the transmitted signal from electrode C. Reference electrodes R may still be used for the electrochemical cell in this context. The reflected signal detected from the working electrode W may then be used in the same manner as that described above for the transmitted signal, for measuring various characteristics of the electrochemical change.

By combining or mixing electrical signals of different frequencies, the embodiment of FIG. 10 enables sums and differences or other combinations of the n frequencies to be generated and applied to the sample 26. This is advantageous for a number of reasons as described below.

The signal output resulting from combining two sine wave signals of different frequencies is illustrated in FIG. 12. As shown in FIG. 12, by combining two signals of different amplitudes, one would obtain sharp spikes 350 of amplitudes greater than the amplitudes of the two sine wave signals from the oscillators, the sine wave signals being combined to obtain the wave form of FIG. 12. The sharp spikes 350 are of a shape determined by the sum of the frequencies of the two input sine waves, where the sharp spikes 350 would occur at a frequency equal to the difference between the two input sine wave forms. In FIG. 12, the period of such spikes 350 is t, which is greater than the periods of either one of the two input sine wave forms. The duty cycle of the spikes is 1/t.

Where FIG. 12 is a graphical illustration of a voltage wave form of the signal resulting from combining input voltage signals of two different frequencies, the wave form obtained has a higher amplitude than the two input voltage signals. It is evident that spikes 350 exceed the threshold 352 only for short periods of time at a duty cycle 1/t. If the voltage wave form of FIG. 12 is generated by combining two voltage wave forms having frequencies f1, f2, then the duty cycle 1/t is given by the difference frequency f1–f2 of the two input frequencies. The shape of the spikes 350 is determined by the sum f1+f2 of the two input frequencies. Therefore, by choosing the proper input frequencies f1, f2, it is possible to control the shape of the spikes 350 as well as the duty cycle of the spikes. Instead of combining the input signals as illustrated in FIG. 12, it is also possible to mix the input signals and apply the mixed signal instead to form wave forms of the desired shape and duty cycle. Where the voltage wave form of the signal applied to the probe tip 22a of the ACSTM or sample 26 results from combining or mixing more than two signals of different frequencies, it is possible to further fine tune the shape and duty cycle of the spikes. By combining or mixing input signals of two frequencies and applying the combined or mixed signal to the ACSTM, the response of the substance(s) may be measured at the difference frequency instead of at higher frequencies. This may be advantageous if measurement at such low frequency has a better signal to noise ratio than at certain higher frequencies.

The scheme of FIG. 10 may be advantageous for applications in electrochemistry, such as when applied to the electrochemical cell of FIG. 8, or simply where sample 26 in FIG. 10 is undergoing electrochemical changes, such as in a living cell. By using multiple source and detection frequencies, it is possible to analyze and to separate the effects of more than one electrochemically generated species prior to diffusion away from the electrode at which they are generated and/or subsequent reaction. It is also possible to analyze simultaneously multiple chemical species where the electrochemical environment is rapidly changing, such as in electrochemical probing of living cells. It is also possible to determine "fast" reaction rate and mechanisms. The separation/speciation of the multiple components in each case could be done on the basis of: (1) the diffusion rate to and from the electrode, (2) the generation or reaction rate adds on near the electrode, and (3) the generation or reaction potential. This is explained in more detail below.

As discussed above in reference to FIG. 12, by combining two sine wave signals of different frequencies and amplitudes, one would obtain sharp spikes 350 of amplitudes greater than the amplitudes of the two sine wave signals from the oscillators, where the sharp spikes 350 are of a shape determined by the sum of the frequencies of the two input sine waves, where the sharp spikes 350 would occur at a frequency equal to the difference between the two input sine wave forms. Such multiple frequency wave form as shown in FIG. 12 will be useful in electrochemistry. Thus, if sharp spikes 350 obtained from combining two frequencies from two oscillators from 21(1)–21(n) are at an amplitude which exceeds certain generation or reaction potentials, certain species A would cause to be generated at the electrodes by such voltage spikes. Such species A then reacts with another species B to give rise to another species C. If all of the species B near the electrodes have been consumed by the reaction, such reaction cannot continue until species B has time to diffuse to the vicinity of the electrodes again. In such event, the input frequencies of the two oscillators from 21(1)–21(n) may be controlled so as to give rise to a long enough period t (relaxation time), to allow adequate time for a species B to diffuse to the vicinity of the electrodes. Then another sharp spike 350 would occur, causing the species A generated to again react with species B to generate species C. In order to provide a detectable signal, the different species must be detected repeatedly at the difference frequency between the two input sine wave frequencies to yield a detectable signal at the analyzer 306. In other words, an electrochemical signal due to this event would appear at the difference frequency, such as f1–f2 or its harmonics, where f1, f2 are input frequencies at two of the oscillators 21(1)–21(n).

FIGS. 13A, 13B are schematic views of a one-dimensional array and a two-dimensional array respectively of Coulomb blockade devices that are currently used. FIGS. 13A, 13B are taken from "Single Charge Tunneling Coulomb Blockade Phenomena in Nanostructures," edited by Hermann Grabert and Michel H. Devoret, NATO ASI Series, Series B: Physics, Vol. 294, Chap. 1, p. 17, FIG. 9. As described in the above-referenced book edited by Grabert and Devoret, when the appropriate AC voltages with frequency f are applied to the gates (i.e., to the nodes 504(1), 504(2), . . . , 504(m-1)) in FIG. 13A, between adjacent blockade devices 502(1), 502(2), . . . , 502(m), the current flowing between input 506 and output 508 is proportional to the frequency f. Therefore, by controlling the frequency applied, it is possible to generate precise currents. This is the basis of high precision single charged tunneling current sources. See Devoret and Grabert, page 16, lines 1–7.

For the array 500 to act as an effective current standard, it is desirable for the devices 502(1)–502(m), collectively referred to as devices 502, to have the same resonance frequency. If the devices 502 have somewhat different resonance frequencies, this will cause array 500 used as a current standard to be inaccurate. To detect whether the Coulomb blockade devices have the same resonance frequencies, an input signal including components at two frequencies which are different by a small offset may be applied to the input 506 and the current or voltage at 508 is measured at said at least two frequencies or their harmonics, or various combinations thereof to indicate the accuracy of the standard. In other words, if current standard 500 responds to such input signal by causing a current or voltage at output 508 to include both frequencies or their harmonics, or various confirmations thereof, it tends to indicate that the devices have different resonance frequencies. The apparatus of FIG. 10 may be applied to the current standard 500 by replacing the dotted line box in FIG. 10 by the array 500 so that line 24 is connected to the input 506 and the output 508 of the apparatus 500 is connected to splitter 304.

The above-described adaptation of FIG. 10 connected to array 500 may also be used to detect thresholds of the devices 502 and their charge dissipation characteristics. This can be performed by applying a voltage input signal having the wave form shown in FIG. 12 to the input 506 of the array 500. The voltage wave form of FIG. 12 is obtained again by combining two input voltage wave forms, with frequencies f1, f2 respectively. The respective amplitudes of the two input voltages are varied so that the amplitude of spikes 350 is increased to exceed a predicted threshold 352 of one of the Coulomb blockade devices in the array 500. As discussed above, threshold 352 is indicated by the detection of an increase of higher harmonics and their combinations in the spectra. Thus, threshold 352 of the device would be predicted or indicated by presence of large amplitudes of the higher harmonics of the difference frequency f1–f2 or their combinations in the current or voltage detected by the ACSTM.

The charge dissipation characteristics of the Coulomb blockade devices in the array may be detected as follows. If the frequency f1 is higher than the frequency f2, then the oscillator that generates the voltage signal at frequency f1 is tuned to reduce the frequency f1, while maintaining the same amplitude. If spikes 350 are indeed just above threshold 352, and if the time period during which the spikes exceed threshold 352 becomes comparable to the time scale of dissipation of the devices, this tuning has the effect of broadening the spikes 350 (by reducing f1+f2), thereby increasing their widths, and reducing the difference frequency f1–f2. This prolongs the time during which the total input voltage wave form shown in FIG. 12 exceeds the threshold 352 of the particular Coulomb blockade device, and causes the amplitudes of the higher harmonics of the difference frequency f1–f2 and their combinations to decrease relative to the amplitudes of the lower harmonics of the difference frequency and their combinations. Comparison of the amplitudes of the higher and lower harmonics of the difference frequency as the higher frequency of the frequencies of the two sine waves combined is reduced would indicate the time scale of charge dissipation of the Coulomb blockade devices. While the invention as applied to array 500 is illustrated above by example to an array 500 where the blockade devices are arranged in series, it will be understood that the invention is similarly applicable where the derides are arranged in parallel instead or an array with a combination of series and parallel connected devices.

The above described schemes for detecting inaccuracies in array 500 used as a current standard or threshold detection in array 500 may also be applied to the two-dimensional array 600 with input 606 and output 608 in the manner similar to that described above for array 500, where line 24 of FIG. 10 is connected to input 606 and output 608 of array 600 connected to splitter 304 in FIG. 10, replacing the dotted line box in FIG. 10.

FIG. 14 is a schematic diagram of a high frequency STM for imaging insulator or conductive surfaces using throughput attenuation with a network analyzer, or using non-linear harmonic recording with a spectrum analyzer, and a DC source and a DC detector. From a comparison of FIGS. 1 and 14, it will be evident that, in addition to the components present in FIG. 1, device 700 also includes a DC source 702. The DC voltage from source 702 is coupled together with the AC signal from the sweep oscillator 21 through a bias network 704 to line 24 connected to the tip 22a of the STM. Bias network 704 includes an inductor 706 for coupling a DC voltage or low frequency signal to line 24. The high frequency signal from oscillator 21 is coupled to line 24 through a capacitor 708 in the bias network. In this manner, bias network 704 adds the DC bias voltage or a low frequency signal from source 702 to the high frequency signal from the sweep oscillator 21 and supply the summed signal having both DC and AC components to line 24.

To detect the current that passes between tip 22a of the STM and counter electrode 28 through the sample (not shown), the signal from counter electrode 28 is fed through another bias network 704 which separates the DC or low frequency components from the high frequency components which are supplied through capacitor 708 to line 40 which is connected to a spectrum or analyzer 30. The DC or low frequency components of the current from counter electrode 28 are coupled through an inductor 706 to a current amplifier 710 to detect the DC or low frequency current. The current detected by amplifier 710 may be fed back to piezo controllers 34 in the constant current mode in lieu of or in addition to the AC signal detected as described above. Instead of using oscillators and a DC source as described above in reference to FIG. 14, it is also possible to employ a source generating a signal pulse or a signal transient. In general, one can use a source that generates a DC signal, an AC signal, a signal pulse or a signal transient or a combination of two or more thereof; all such variations are within the scope of the invention.

If instead of using a voltage source 702 to supply a DC voltage and current, a DC or low frequency current source is used instead, device 700 is modified simply by replacing the voltage source 702 by a low frequency or DC current source and the current amplifier 710 is replaced by a voltmeter for detecting the DC or low frequency voltage across the sample. Aside from such change, device 700 will function in essentially the same manner as that described above. Instead of applying the summed signal having both AC and DC components to tip 22a of the STM as described above, such signal may instead be applied to the sample through counter electrode 28; in such event, the current through a sample is then detected at tip 22a of the STM so that the tip is then connected to analyzer 30 and detector 710 through the bias network 704 instead. Such and other possible variations are all within the scope of the invention.

Most of the description above are taken from the parent and companion applications. Described herein below are features concerning the writing and erasing of data.

FIGS. 15A, 15B are respectively top and side views of a model of a mixed monolayer containing ferrocene-terminated (Fc) and unsubstituted alkanethiols coadsorbed on a gold surface. The figure is taken from C.E.D. Chidsey et al., *Journal of the American Chemical Society* 112, 4301–6, 1990. The structure illustrated in FIGS. 15A, 15B are described in "Free Energy and Temperature Dependence of Electron Transfer at the Metal-Electrolyte Interface," C.E.D. Chidsey, *Science*, Vol. 251, pp. 919–922, Feb. 22, 1991. As described in the above-referenced article by Chidsey, electrons do transfer between the ferrocene functional group and the underlying gold layer, where the transfer rate is a function of the length of the chains in the alkanethiol linkage layer. In other words, if the ferrocene functional groups are charged, the rate of dissipation of such charge would depend on the length of the alkanethiol chains.

The ferrocene functional groups will change charge state when an appropriate voltage or signal is applied thereto and an electron or electrons are withdrawn from or injected thereto. In other words, the ferrocene functional groups have two charge states: a first charge state and a second state in which the groups are more positively charged than in the first charge state. Therefore, by applying a voltage or signal to a ferrocene functional group and withdrawing an electron or electrons therefrom, it is possible to change a ferrocene functional group originally in a first charge state to the second charge state. Conversely, by applying a voltage or signal and injecting an electron or electrons thereto, it is possible to change a ferrocene functional group originally in a second charge state to the first charge state. Changing charge states and the injection or withdrawal of an electron or electrons may be accomplished by applying a signal that is a DC signal, an AC signal, a signal pulse or transient or a combination of two or more thereof to the ferrocene functional group in order to withdraw or inject electron or electrons. Such voltage or signal may be applied and electron or electrons withdrawn or injected advantageously using the probe tip of a STM. Alternatively, the counter electrode of the STM can be used instead. One or more electrodes can be used for this purpose.

A ferrocene-terminated alkanethiol forms a monolayer on a gold surface. Or ferrocene-terminated alkanethiols are mixed with one or more other alkanethiols in solution so as to form a mixed composition surface monolayer on gold where the mixed composition surface is illustrated in FIGS. 15A, 15B. By using the STM, it is possible to render the ferrocene functional groups at one portion of the layer to be in a first charge state and those at a different portion to be in a second charge state. Then when a STM is used to apply a time varying signal at the two portions in different charge states, the two portions would give rise to different readings of amplitudes of current or voltage. Such differences can be discerned to detect the charge states of the two portions. Thus, if the first charge state stands for a digital "0" and the second charge state stands for a digital "1", then the two portions of the surface of the layer shown in FIGS. 15A, 15B form a digital memory with a two-bit capacity. If a one-bit memory is desired, then only one portion of the surface is used; usually, of course, the surface would have many such portions forming a high capacity memory. By changing the ferrocene functional groups in a large area of the layer to either the first "0" or the second "1" charge state, this is equivalent to erasing data from that area.

Instead of using a gold or other metal substrate, the ferrocene-terminated alkanethiol may be supported on a substrate made of a semiconductor material such as gallium arsenide GaAs (100) as described in "A New Class of Organized Self-Assembled Monolayers: Alkane Thiols on GaAs (100)," C. Wade Sheen et al., *Journal of the American Chemical Society*, 1992, 114, 1514–1515. As described by the article by Sheen et al., self-assembled monolayers can be prepared on a wide variety of other surfaces including $SiO_2$ and oxidized metal. This invention is unique in that writing, erasing and reading of data can be done on an insulator surface as well as a conductive surface. The ferrocene-terminated alkanethiol is an example of a metal-containing functionality terminating a linkage layer. Instead of using such a metal-containing functionality terminating a linkage layer, it is also possible to use an organic termination; one example of a suitable organic termination is an organic redox indicator such as Eriochrom-black-T. Other examples of organic redox indicators are methylene-blue, viologen and diphenylbenzidene. Obviously, other surface bound redox systems may also be used whether they are organic or inorganic. A linkage layer such as alkanethiol may be covalently bonded to or absorbed on a substrate such as a gold layer. All such variations are within the scope of the invention.

Self assembled monolayers can also be prepared where the functional groups are not at the terminal ends of molecules but still exposed at the surface; these groups can be used to hold charges and their charge states can be altered to store data that can be interrogated. Self assembled monolayers can also be prepared where more than one functional group can be exposed at a surface where each group has multiple charge states that can be used to store data. For example, disubstituted dialkanedisulfides can be adsorbed on a substrate at a point intermediate between two terminal ends leaving both ends exposed at the surface and available for data storage and interrogation. See "Comparison of Self-Assembled Monolayers on Gold: Coadsorption of Thiols and Disulfides," C. D. Bain et al., Langmuir, Vol. 5, No. 3, 1989, 723–727. All such variations are within the scope of the invention.

One advantage of the ferrocene-terminated alkanethiols or similar films is that they self-assemble. Other films can be made by the Langmuir-Blodgett technique as known to those skilled in the art. Using such technique, it is possible to deposit a monolayer or multiple layers of ferrocene functional groups and bond such layer or layers to the intermediate linkage layer. The surface layer that can change charge state to store data that can be interrogated is referred to below as the outer active layer. It is also possible to place, on top of the substrate but beneath the outer active layer, a layer or layers different in composition from the outer active layer. All such variations are within the scope of the invention.

Using the ferrocene-terminated alkanethiol as a memory layer, it is possible to store a large quantity of data on the surface. If the surface were to be divided into five nanometer by five nanometer squares, and the ferrocene functional groups in each square were regarded as a portion of the surface which is to be charged to one of two states, then a one millimeter square surface of the ferrocene-terminated alkanethiol layer will comprise a memory of 400 megabits. Using technology similar to that applied to disk drives and optical disks, it is possible to divide the memory layer into different pages, such as by bit patterns or fiduciary markers at the corners of each page. In a real memory, using the STM, the functional groups in a first set of one or more portions of the ferrocene-terminated alkanethiol layer are caused to be in the first charge state, and the functional groups in a second set of one or more portions of the ferrocene-terminated alkanethiol layer are caused to be in the second charge state.

When the features described above in FIGS. 1–14 are used to interrogate or read the data stored by the layer of FIGS. 15A–15B in a read mode, the amplitude of the current or voltage may be measured using a STM as described above in reference to FIGS. 1–14. The signal applied by the STM or another instrument in a read mode may be a DC signal, an AC signal, a signal pulse or signal transient, or a combination of two or more thereof. The signal detected may simply be the amplitude of a voltage or current or the amplitudes of current or voltage at one or more frequencies within a predetermined spectrum. The signal measured may be the current through or voltage across two electrodes (such as between tip 22a and counter electrode 28 through the sample), or a signal reflected from the sample. If the functional groups of the memory layer can have more than two charge states such as viologen, then it may be advantageous to apply a time varying signal having two or more frequencies in a read mode. In such event, it is possible to detect which of the three or more charge states that the portion of the memory layer is in. Where the functional group has two different sites each having two or more charge states that are different from those of the other, or where a chain in the linkage layer terminates in two distinct functional groups each having two or more charge states that are different from those of the other functional group such as for doubly substituted alkanedisulfides, this means that each portion of the surface of the memory layer can store two or more bits of information. In order to simultaneously read the two or more bits of information, it may be advantageous to apply, in the read mode, a time-varying signal to the layer where the signal has two or more frequencies, and detect simultaneously the amplitudes of the current or voltage at the two or more frequencies, their harmonics or combinations thereof in order to read simultaneously the two or more bits of information from the same portion of the surface.

One important consideration for memory design is that the reading process would not erase or otherwise alter the data stored. FIGS. 16A–16C are voltammograms for oxidation-reduction systems to illustrate how this can be done. FIGS. 16A, 16B, 16C illustrate the characteristics of three different oxidation-reduction characteristics of different substances. In FIG. 16A, the oxidation and reduction curves of a substance overlap substantially, indicating that the substance has the nearly same characteristic electrical potential or voltage for oxidation and for reduction. It may be difficult to read data stored using a layer of such substance without erasing the data, since applying a signal at its characteristic potential for oxidation and for reduction may cause it to change charge state. The voltammograms in FIGS. 16B, 16C show considerable hystersis so that it is possible to read the charge states of such substances without altering them, thereby preserving the data originally stored. Thus, as long as the overall voltage amplitude applied is safely away and between the two peaks in each of FIGS. 16B, 16C, data can be read without erasure. Analogous to ECL memories, however, it may be desirable to choose a substance whose oxidation and reduction characteristic potentials are not too far apart so as to increase switching speed.

When an electron or electrons are injected to or withdrawn from certain material such as 2,2,2-trichloroethyl carbamates, 2,2,2-trichloroethyl carbonates, 2,2,2-trichloroethyl esters, such material or compounds will dissociate. In the above listed compounds, for example, the chloro group will accept an electron or electrons and cause the compound to dissociate into an amine, trichloroethylene and carbon dioxide. Such dissociation changes the structure of the compound. Since the different structure after the dissociation can be distinguished from that before the dissociation by means of their different current or voltage amplitudes therethrough or reflected therefrom when subjected to a current or voltage from an electrode, the change in structure can be used to store data in a layer of the material. Such data can be read by applying to the layer a DC signal, an AC signal having one or more frequencies, a combination of such AC and DC signals, or a signal pulse or transient, or a combination of two or more of the above. Then, the amplitude of a DC or AC current or voltage is detected, or the amplitude(s) of the current or voltage may be detected at one or more distinct frequencies, or over a frequency spectrum. In a real memory, using the STM, the structures in a first set of one or more portions of the 2,2,2-trichloroethyl carbamates, 2,2,2-trichloroethyl carbonates, or 2,2,2-trichloroethyl esters layer are caused to be changed, and the structures in a second set of one or more portions of the layer are left unchanged, in order to store data. For example, when an electron is injected, 2,2,2-trichloroethyl carbonate of an alkyl alcohol would dissociate into an alkyl alcohol chain, carbon dioxide and 1,1-dichloroethylene. See "Protective Groups in Organic Chemistry," T. W. Greene, P. G. M. Wuts, 2nd, John Wiley & Sons 1991, p. 3; V. G. Mairanovsky, *Angew. Chem., Int. Ed., Eng,* 15, 281 (1976); and M. F. Semmelhack & G. E. Heinsohn, *J. Am. Chem. Soc.,* 94, 5139 (1972).

The above-described writing and erasing process involving changing charge states or dissociation occurs in very short time intervals of the order of nanoseconds and therefore does not limit the writing and erasing speed in view of the present scanning speed of the STM. Assuming the STM is operated at 10 KHz, it is possible to achieve a write and erase speed of the order of 5 or 10 microseconds per bit.

While the invention is described above in reference to various embodiments, it will be understood that various changes and modifications may be made without departing from the scope of the invention which is to be limited only by the appended claims. For example, while the embodiments are illustrated showing a gap between the tip of the STM and the sample, this is not required and the invention may function essentially as described even though the tip contacts the sample. Similarly, while the preferred embodiments above may be illustrated by reference to sources for providing or to devices for detecting AC signals to measure a sample or substance, it will be understood that said sources may provide and said detection devices may detect a DC signal, an AC signal, a signal pulse, a signal transient, or a combination of two or more thereof, the term signal herein referring to a current and/or a voltage, for measuring the sample or substance and the various features of the invention described above are similarly applicable.

What is claimed is:

1. An apparatus for storing data, comprising:
   a layer of material having at least one portion that will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components thereby changing the structure of said at least one portion in response to an applied voltage and withdrawal or injection of an electron or electrons in order to store data; and
   a source applying an AC electrical signal having a frequency component at a frequency in the range of 1.5 to 22 GHz to said at least one portion to change its charge state or to cause it to oxidatively or reductively dissociate into components.

2. The apparatus of claim 1, wherein said source is a part of an ACSTM.

3. The apparatus of claim 1, said layer having a plurality of said portions, wherein said source applies the signal to said plurality of portions to change their charge states or to cause them to oxidatively or reductively dissociate into components, and wherein the apparatus further comprises a device for interrogating said plurality of portions to detect the charge state or structure of the portions in order to read the stored data.

4. The apparatus of claim 3, said device comprising:
   a second source for providing a time varying electrical input signal;
   two electrodes for coupling the signal to the at least one portion of the layer;
   a circuit connected to one of the electrodes for measuring the amplitudes of the current or voltage across the electrodes to read the stored data.

5. The apparatus of claim 4, further comprising a circuit measuring the amplitudes of the current or voltage at said at one portion at a predetermined frequency to read the stored data.

6. The apparatus of claim 5, further comprising an electrode spaced apart from the layer, wherein said circuit measures the amplitudes of the current or voltage by measuring the amplitudes of the current or voltage between the electrode and the at least one portion or the amplitudes of the current or voltage reflected towards the electrode by the at least one portion.

7. The apparatus of claim 3, said device comprising:
   a second source for providing a time varying electrical input signal;
   an electrode coupling the signal to the at least one portion of the layer and detecting a reflected electrical signal from the at least one portion in response to the input signal; and
   a circuit connected to one of the electrodes for measuring the amplitude of the reflected signal from the electrode to read the stored data.

8. The apparatus of claim 7, said circuit measuring the amplitudes of the reflected signal from the electrode at frequencies over a predetermined spectrum to detect atomic or molecular spectra or electrochemical response of the at least one portion, said spectra or response indicating the charge state or structure of the at least one portion and the data stored.

9. The apparatus of claim 3, said portion having a plurality of charge states, said device comprising:
   a second source for providing a time varying electrical input signal, said input signal including components of at least two frequencies;
   one or more electrodes for coupling the signal to the at least one portion of the layer; and
   a circuit connected to the one or more electrodes for simultaneously measuring the amplitudes of the current or voltage reflected by or across the at least one portion at said at least two frequencies or their harmonics, or their sums and differences or combinations thereof to detect atomic or molecular spectra or electrochemical response of the at least one portion to detect its charge states.

10. The apparatus of claim 3, wherein the at least one portion has first and second charge states each having a characteristic voltage, the characteristic voltages of the first and second charge states being different, and wherein said device interrogates the at least one portion of the layer by applying thereto a voltage signal whose amplitude is between the characteristic voltages of the first and second charge states to detect the charge state of the at least one portion in order to read the stored data without changing the charge state of the at least one portion.

11. The apparatus of claim 1, wherein said layer includes an insulating surface supported on a substrate.

12. The apparatus of claim 11, wherein said layer includes a redox system on said substrate.

13. The apparatus of claim 12, said system including a linkage layer that includes a metal-containing or organic-containing functionality terminating or in the linkage layer, said linkage layer covalently bound to or adsorbed on said substrate.

14. The apparatus of claim 13, wherein said metal-containing functionality includes ferrocene.

15. The apparatus of claim 12, said system including a linkage layer that includes an organic-containing functionality terminating or in the linkage layer, said linkage layer covalently or adsorbed on said substrate.

16. The apparatus of claim 15, said organic-containing functionality including organic redox indicators.

17. The apparatus of claim 1, said material including two or more layers of different composition.

18. The apparatus of claim 17, wherein one of said layers will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components thereby changing the structure of said at least one portion in response to an applied voltage and withdrawal or injection of an electron or electrons in order to store data defining an active layer, and another layer is a linkage layer.

19. The apparatus of claim 1, said source including an electrode spaced apart from or in contact with said layer.

20. A method for storing data comprising the following steps:
   providing a layer or layers of material having at least one portion that will reversibly change from a first charge state to a second charge state in response to an applied voltage or signal and change from the second charge state to the first charge state in response to an applied voltage or signal to store or erase data, or that will oxidatively or reductively dissociate into components thereby changing the structure of said at least one portion in response to an applied voltage or signal in order to store data; and
   applying an AC signal having a component at a frequency in the range of 1.5 to 22 GHz to said at least one portion to change its charge state or to cause it to oxidatively or reductively dissociate into components in order to store data.

21. The method of claim 20, said layer or layers provided in the providing step having a plurality of said portions, wherein said applying step applies the signal to said plurality of portions to change their charge states or to cause them to oxidatively or reductively dissociate into components, wherein the method further comprises a step of interrogating said plurality of portions to detect the charge state or structure of the portions in order to read the stored data.

22. The method of claim 21, said interrogating step comprising:
   providing a time varying electrical input signal to the at least one portion of the layer;
   measuring the amplitudes of the current or voltage across the electrodes at one or more frequencies to read the stored data.

23. The method of claim 22, wherein said measuring step measures the amplitudes of the current or voltage across the electrodes over a predetermined spectrum to detect atomic or molecular spectra or electrochemical response of the at least one portion, said spectra or response indicating the charge state or structure of the at least one portion and the data stored.

24. The method of claim 22, said measuring step measuring the amplitudes of the current or voltage at said at least one portion at a predetermined frequency to read the stored data.

25. The method of claim 24, said measuring step employing an electrode spaced apart from the layer, wherein said measuring step measures the amplitudes of the current or voltage between the electrode and the at least one portion or the amplitudes of the current or voltage reflected towards the electrode by the at least one portion.

26. The method of claim 21, said interrogating step comprising:
   providing a time varying electrical input signal across a gap to said at least one portion in the layer;
   detecting across the gap a reflected electrical signal from the at least one portion in response to the input signal; and
   measuring the amplitude of the reflected signal from the electrode to read the stored data.

27. The method of claim 26, wherein said measuring step measures the amplitudes of the reflected signal from the electrode over a predetermined spectrum to detect atomic or molecular spectra or electrochemical response of the at least one portion, said spectra or response indicating the charge state or structure of the at least one portion and the data stored.

28. The method of claim 21, said portion having a plurality of charge states, said interrogating step comprising:

providing a time varying electrical input signal to said at least one portion, said input signal including components of at least two frequencies; and simultaneously measuring the amplitudes of the current or voltage reflected by or across the at least one portion at said at least two frequencies or their harmonics, or their sums and differences or combinations thereof to detect atomic or molecular spectra or electrochemical response of the at least one portion to detect its charge states.

29. The method of claim 21, wherein the at least one portion has first and second charge states each having a characteristic voltage, the characteristic voltages of the first and second charge states being different, and wherein said interrogating step interrogates the at least one portion of the layer by applying thereto a voltage signal whose amplitude is between the characteristic voltages of the first and second charge states to detect the charge state of the at least one portion in order to read the stored data without changing the charge state of the at least one portion.

30. An apparatus for storing data, comprising:
   (a) a layer of material having at least one portion that will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components thereby changing the structure of said at least one portion in response to an applied voltage or signal and withdrawal or injection of an electron or electrons in order to store data; and
   (b) a device for interrogating the at least one portion of the layer to detect the charge state or structure of the at least one portion in order to read the stored data, said device comprising:
   a source for providing a time varying electrical input signal;
   one or more electrodes for coupling the signal to the at least one portion of the layer;
   a circuit connected to one of the electrodes for measuring the amplitude of the current or voltage at a predetermined frequency by means of the electrodes to read the stored data.

31. The apparatus of claim 30, said circuit measuring the amplitudes of the current or voltage by means of the electrodes at frequencies over a predetermined spectrum to detect atomic or molecular spectra or electrochemical response of the at least one portion, said spectra or response indicating the charge state or structure of the at least one portion and the data stored.

32. The apparatus of claim 30, said time varying electrical input signal provided by said source including components of at least two frequencies, said circuit simultaneously measuring the amplitudes of the current or voltage at the at least one portion at said at least two frequencies or their harmonics, or their sums and differences or combinations thereof to detect atomic or molecular spectra or electrochemical response of the at least one portion to detect its charge states.

33. The apparatus of claim 32, wherein the at least one portion has first and second charge states each having a characteristic voltage, the characteristic voltages of the first and second charge states being different, and wherein said device interrogates the at least one portion of the layer by applying thereto a voltage signal whose amplitude is between the characteristic voltages of the first and second charge states to detect the charge state of the at least one portion in order to read the stored data without changing the charge state of the at least one portion.

34. The apparatus of claim 30, further comprising a second source applying an AC electrical signal having a frequency component at a frequency in the range of 1.5 to 22 GHz to said at least one portion to change its charge state or to cause it to oxidatively or reductively dissociate into components to store data at said at least one portion.

35. The apparatus of claim 30, wherein one or more electrodes are separated from said at least one portion of the layer by a gap.

36. An apparatus for storing data, comprising:
   (a) a layer of material having at least one portion that will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components thereby changing the structure of said at least one portion in response to an applied voltage or signal and withdrawal or injection of an electron or electrons in order to store data; and
   (b) a device for interrogating the at least one portion of the layer to detect the charge state or structure of the at least one portion in order to read the stored data, said device comprising:
   a source for providing a time varying electrical input signal;
   an electrode coupling the signal to the at least one portion of the layer and detecting a reflected electrical signal from the at least one portion in response to the input signal; and
   a circuit connected to one of the electrodes for measuring the amplitude of the reflected signal from the electrode to read the stored data.

37. The apparatus of claim 36, said circuit measuring the amplitudes of the reflected signal from the electrode at frequencies over a predetermined spectrum to detect atomic or molecular spectra or electrochemical response of the at least one portion, said spectra or response indicating the charge state or structure of the at least one portion and the data stored.

38. The apparatus of claim 36, further comprising a second source applying an AC electrical signal having a frequency component at a frequency in the range of 1.5 to 22 GHz to said at least one portion to change its charge state or to cause it to oxidatively or reductively dissociate into components to store data at said at least one portion.

39. The apparatus of claim 36, wherein said electrode is separated from said at least one portion of the layer by a gap.

40. A method for storing data comprising the step of:
   providing a layer of material having at least one portion that will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components thereby changing the structure of said at least one portion in response to an applied voltage or signal and withdrawal or injection of an electron or electrons in order to store data; and interrogating the at least one portion of the layer to detect the charge state or structure of the at least one portion in order to read the stored data, said interrogating step including the steps of:

providing a time varying electrical input signal to the at least one portion of the layer by means of one or more electrodes; and measuring the amplitude of the current or voltage by means of the electrodes at a predetermined frequency to read the stored data.

41. The method of claim 40, said measuring step measuring the amplitudes of the current or voltage by means of the electrodes at frequencies over a predetermined spectrum to detect atomic or molecular spectra or electrochemical response of the at least one portion, said spectra or response indicating the charge state or structure of the at least one portion and the data stored.

42. The method of claim 40, said time varying electrical input signal provided in the providing step including components of at least two frequencies, said measuring step simultaneously measuring the amplitudes of the current or voltage at the at least one portion at said at least two frequencies or their harmonics, or their sums and differences or combinations thereof to detect atomic or molecular spectra or electrochemical response of the at least one portion to detect its charge states.

43. The method of claim 40, wherein the at least one portion has first and second charge states each having a characteristic voltage, the characteristic voltages of the first and second charge states being different, and wherein said interrogating step interrogates the at least one portion of the layer by applying thereto a voltage signal whose amplitude is between the characteristic voltages of the first and second charge states to detect the charge state of the at least one portion in order to read the stored data without changing the charge state of the at least one portion.

44. The method of claim 40, further comprising a step of applying an AC electrical signal having a frequency component at a frequency in the range of 1.5 to 22 GHz to said at least one portion to change its charge state or to cause it to oxidatively or reductively dissociate into components to store data at said at least one portion.

45. The method of claim 40, wherein during the providing and measuring steps, said one or more electrodes are separated from said at least one portion of the layer by a gap.

46. A method for storing data, comprising the steps of:

providing a layer of material having at least one portion that will reversibly change from a first charge state to a second charge state in response to an applied voltage or signal and withdrawal of an electron or electrons and change from the second charge state to the first charge state in response to an applied voltage or signal and injection of an electron or electrons to store or erase data, or that will oxidatively or reductively dissociate into components thereby changing the structure of said at least one portion in response to an applied voltage or signal and withdrawal or injection of an electron or electrons in order to store data; and interrogating the at least one portion of the layer to detect the charge state or structure of the at least one portion in order to read the stored data, said interrogating step comprising the steps of:

providing a time varying electrical input signal to the at least one portion of the layer by means of an electrode;

detecting a reflected electrical signal from the at least one portion in response to the input signal; and measuring the amplitude of the reflected signal from the electrode to read the stored data.

47. The method of claim 46, said measuring step measuring the amplitudes of the reflected signal from the electrode at frequencies over a predetermined spectrum to detect atomic or molecular spectra or electrochemical response of the at least one portion, said spectra or response indicating the charge state or structure of the at least one portion and the data stored.

48. The method of claim 46, further comprising applying an AC electrical signal having a frequency component at a frequency in the range of 1.5 to 22 GHz to said at least one portion to change its charge state or to cause it to oxidatively or reductively dissociate into components to store data at said at least one portion.

49. The method of claim 46, wherein during the providing and detecting steps, said one or more electrodes are separated from said at least one portion of the layer by a gap.

50. The apparatus of claim 4, said circuit measuring the amplitudes of the current or voltage across the electrodes at frequencies over a predetermined spectrum to detect atomic or molecular spectra or electrochemical response of the at least one portion, said spectra or response indicating the charge state or structure of the at least one portion and the data stored.

* * * * *

UNITED STATES PATENT AND TRADEMARK OFFICE
CERTIFICATE OF CORRECTION

PATENT NO. : 5,434,842
DATED : July 18, 1995
INVENTOR(S) : Weiss et al.

It is certified that error appears in the above-indentified patent and that said Letters Patent is hereby corrected as shown below:

On the Title Page, [75] replace:
"Inventors:   Paul S. Weiss; Stephan J. Stranick, both of State College, Pa."

with
--Inventors:   Paul S. Weiss, State College, Pa.; Barry Willis, Los Altos Hills, Ca.; Stephan J. Stranick, State College, Pa.;   --

Signed and Sealed this

Thirteenth Day of February, 1996

Attest:

BRUCE LEHMAN

Attesting Officer

Commissioner of Patents and Trademarks